(12) United States Patent
Partridge et al.

(10) Patent No.: US 7,075,160 B2
(45) Date of Patent: Jul. 11, 2006

(54) MICROELECTROMECHANICAL SYSTEMS AND DEVICES HAVING THIN FILM ENCAPSULATED MECHANICAL STRUCTURES

(75) Inventors: Aaron Partridge, Palo Alto, CA (US); Markus Lutz, Palo Alto, CA (US); Silvia Kronmueller, Schwaikheim (DE)

(73) Assignee: Robert Bosch GmbH, Stuttgart (DE)

( * ) Notice: Subject to any disclaimer, the term of this patent is extended or adjusted under 35 U.S.C. 154(b) by 20 days.

(21) Appl. No.: 10/454,867

(22) Filed: Jun. 4, 2003

(65) Prior Publication Data

US 2004/0248344 A1 Dec. 9, 2004

(51) Int. Cl.
*H01L 27/14* (2006.01)
*H01L 29/82* (2006.01)
*H01L 29/84* (2006.01)

(52) U.S. Cl. .................. 257/414; 257/415; 257/417
(58) Field of Classification Search ........ 257/414–420, 257/787, 788, 790
See application file for complete search history.

(56) References Cited

U.S. PATENT DOCUMENTS

| | | |
|---|---|---|
| 4,665,610 A | 5/1987 | Barth |
| 4,674,319 A | 6/1987 | Muller et al. |
| 4,766,666 A | 8/1988 | Sugiyama et al. |
| 4,849,071 A | 7/1989 | Evans et al. |
| 4,945,769 A | 8/1990 | Sidner et al. |
| 4,990,462 A | 2/1991 | Sliwa, Jr. |
| 5,075,253 A | 12/1991 | Sliwa, Jr. |
| 5,139,624 A | 8/1992 | Searson et al. |
| 5,156,903 A | 10/1992 | Okumura et al. |
| 5,338,416 A | 8/1994 | Mlcak et al. |
| 5,445,991 A | 8/1995 | Lee |
| 5,455,547 A | 10/1995 | Lin et al. |
| 5,461,916 A | 10/1995 | Fujii et al. |
| 5,470,797 A | 11/1995 | Mastrangelo |
| 5,491,604 A | 2/1996 | Nguyen et al. |
| 5,504,026 A | 4/1996 | Kung |
| 5,510,156 A | 4/1996 | Zhao |
| 5,517,123 A | 5/1996 | Zhao et al. |

(Continued)

FOREIGN PATENT DOCUMENTS

EP 0 451 992 10/1991

(Continued)

OTHER PUBLICATIONS

"Sealed Vacuum Electronic Devices by Surface Micromachining", Zum et al., IEEE IEDM 91, Sep. 1991, pp. 205-208.

(Continued)

*Primary Examiner*—Mary Wilczewski
*Assistant Examiner*—Monica Lewis
(74) *Attorney, Agent, or Firm*—Neil A. Steinberg

(57) ABSTRACT

There are many inventions described and illustrated herein. In one aspect, the present invention is directed to a MEMS device, and technique of fabricating or manufacturing a MEMS device, having mechanical structures encapsulated in a chamber prior to final packaging. The material that encapsulates the mechanical structures, when deposited, includes one or more of the following attributes: low tensile stress, good step coverage, maintains its integrity when subjected to subsequent processing, does not significantly and/or adversely impact the performance characteristics of the mechanical structures in the chamber (if coated with the material during deposition), and/or facilitates integration with high-performance integrated circuits. In one embodiment, the material that encapsulates the mechanical structures is, for example, silicon (polycrystalline, amorphous or porous, whether doped or undoped), silicon carbide, silicon-germanium, germanium, or gallium-arsenide.

43 Claims, 22 Drawing Sheets

U.S. PATENT DOCUMENTS

| | | | |
|---|---|---|---|
| 5,537,083 A | 7/1996 | Lin et al. |
| 5,540,095 A | 7/1996 | Sherman et al. |
| 5,583,290 A | 12/1996 | Lewis |
| 5,589,082 A | 12/1996 | Lin et al. |
| 5,604,312 A | 2/1997 | Lutz |
| 5,613,611 A | 3/1997 | Johnson et al. |
| 5,616,514 A | 4/1997 | Muchow et al. |
| 5,620,931 A | 4/1997 | Tsang et al. |
| 5,627,317 A | 5/1997 | Offenberg et al. |
| 5,627,318 A | 5/1997 | Fujii et al. |
| 5,631,422 A | 5/1997 | Sulzberger et al. |
| 5,640,039 A | 6/1997 | Chau et al. |
| 5,679,436 A | 10/1997 | Zhao |
| 5,683,591 A | 11/1997 | Offenberg |
| 5,703,293 A | 12/1997 | Zabler et al. |
| 5,721,377 A | 2/1998 | Kurle et al. |
| 5,723,353 A | 3/1998 | Muenzel et al. |
| 5,728,936 A | 3/1998 | Lutz |
| 5,751,041 A | 5/1998 | Suzuki et al. |
| 5,760,455 A | 6/1998 | Hierold et al. |
| 5,761,957 A | 6/1998 | Oba et al. |
| 5,804,083 A | 9/1998 | Ishii et al. |
| 5,818,227 A | 10/1998 | Payne et al. |
| 5,839,062 A | 11/1998 | Nguyen et al. |
| 5,847,280 A | 12/1998 | Sherman et al. |
| 5,858,809 A | 1/1999 | Chau et al. |
| 5,872,024 A | 2/1999 | Fujii et al. |
| 5,880,369 A | 3/1999 | Samuels et al. |
| 5,889,207 A | 3/1999 | Lutz |
| 5,898,218 A | 4/1999 | Hirose et al. |
| 5,919,364 A | 7/1999 | Lebouitz et al. |
| 5,922,212 A | 7/1999 | Kano et al. |
| 5,937,275 A | 8/1999 | Münzel et al. |
| 5,948,991 A | 9/1999 | Nomura et al. |
| 5,955,932 A | 9/1999 | Nguyen et al. |
| 5,959,208 A | 9/1999 | Muenzel et al. |
| 5,969,249 A | 10/1999 | Roessig et al. |
| 5,986,316 A | 11/1999 | Toyoda et al. |
| 5,987,989 A | 11/1999 | Yamamoto et al. |
| 5,992,233 A | 11/1999 | Clark |
| 6,009,753 A | 1/2000 | Tsang et al. |
| 6,028,332 A | 2/2000 | Kano et al. |
| 6,035,714 A | 3/2000 | Yazdi et al. |
| 6,048,774 A | 4/2000 | Yamamoto et al. |
| 6,055,858 A | 5/2000 | Muenzel et al. |
| 6,065,341 A | 5/2000 | Ishio et al. |
| 6,067,858 A | 5/2000 | Clark et al. |
| 6,090,718 A | 7/2000 | Soga et al. |
| 6,100,108 A | 8/2000 | Mizuno et al. |
| 6,106,735 A | 8/2000 | Kurle et al. |
| 6,117,701 A | 9/2000 | Buchan et al. |
| 6,119,518 A | 9/2000 | Itou et al. |
| 6,122,964 A | 9/2000 | Mohaupt et al. |
| 6,125,700 A | 10/2000 | Tsugai et al. |
| 6,140,709 A | 10/2000 | Muenzel et al. |
| 6,142,358 A | 11/2000 | Cohn et al. |
| 6,146,917 A | 11/2000 | Zhang et al. |
| 6,147,756 A | 11/2000 | Zavracky et al. |
| 6,149,190 A | 11/2000 | Galvin et al. |
| 6,151,966 A | 11/2000 | Sakai et al. |
| 6,153,839 A | 11/2000 | Zavracky et al. |
| 6,156,652 A | 12/2000 | Michalicek |
| 6,163,643 A | 12/2000 | Bergmann et al. |
| 6,170,332 B1 | 1/2001 | MacDonald et al. |
| 6,171,881 B1 | 1/2001 | Fujii |
| 6,187,210 B1 | 2/2001 | Lebouitz et al. |
| 6,187,607 B1 | 2/2001 | Offenberg et al. |
| 6,191,007 B1 | 2/2001 | Matsui et al. |
| 6,192,757 B1 | 2/2001 | Tsang et al. |
| 6,199,430 B1 | 3/2001 | Kano et al. |
| 6,199,874 B1 | 3/2001 | Galvin et al. |
| 6,204,085 B1 | 3/2001 | Strumpell et al. |
| 6,210,988 B1 | 4/2001 | Howe et al. |
| 6,214,243 B1 | 4/2001 | Muenzel et al. |
| 6,218,717 B1 | 4/2001 | Toyoda et al. |
| 6,227,049 B1 | 5/2001 | Fujii |
| 6,227,050 B1 | 5/2001 | Fujii et al. |
| 6,230,567 B1 | 5/2001 | Greiff |
| 6,233,811 B1 | 5/2001 | Payne et al. |
| 6,236,281 B1 | 5/2001 | Nguyen et al. |
| 6,240,782 B1 | 6/2001 | Kato et al. |
| 6,244,112 B1 | 6/2001 | Fujii |
| 6,245,593 B1 | 6/2001 | Yoshihara et al. |
| 6,249,073 B1 | 6/2001 | Nguyen et al. |
| 6,250,156 B1 | 6/2001 | Seshia et al. |
| 6,250,165 B1 | 6/2001 | Sakai et al. |
| 6,251,754 B1 | 6/2001 | Ohshima et al. |
| 6,255,741 B1 | 7/2001 | Yoshihara et al. |
| 6,264,363 B1 | 7/2001 | Takahashi et al. |
| 6,274,452 B1 | 8/2001 | Miura et al. |
| 6,275,034 B1 | 8/2001 | Tran et al. |
| 6,276,207 B1 | 8/2001 | Sakai et al. |
| 6,279,585 B1 | 8/2001 | Shiraki et al. |
| 6,282,960 B1 | 9/2001 | Samuels et al. |
| 6,284,670 B1 | 9/2001 | Abe et al. |
| 6,287,885 B1 | 9/2001 | Muto et al. |
| 6,291,315 B1 | 9/2001 | Nakayama et al. |
| 6,291,875 B1 | 9/2001 | Clark et al. |
| 6,296,779 B1 | 10/2001 | Clark et al. |
| 6,297,072 B1 | 10/2001 | Tilmans et al. |
| 6,300,294 B1 | 10/2001 | Robbins et al. |
| 6,307,815 B1 | 10/2001 | Polosky et al. |
| 6,308,567 B1 | 10/2001 | Higuchi et al. |
| 6,311,555 B1 | 11/2001 | McCall et al. |
| 6,315,062 B1 | 11/2001 | Alft et al. |
| 6,318,175 B1 | 11/2001 | Muchow et al. |
| 6,323,550 B1 | 11/2001 | Martin et al. |
| 6,325,886 B1 | 12/2001 | Harris et al. |
| 6,352,935 B1 | 3/2002 | Collins et al. |
| 6,373,007 B1 | 4/2002 | Calcatera et al. |
| 6,378,989 B1 | 4/2002 | Silverbrook |
| 6,386,032 B1 | 5/2002 | Lemkin et al. |
| 6,388,279 B1 | 5/2002 | Sakai et al. |
| 6,389,899 B1 | 5/2002 | Partridge et al. |
| 6,389,903 B1 | 5/2002 | Oba et al. |
| 6,392,144 B1 | 5/2002 | Filter et al. |
| 6,396,711 B1 | 5/2002 | Degani et al. |
| 6,402,968 B1 | 6/2002 | Yazdi et al. |
| 6,416,831 B1 | 7/2002 | Hara et al. |
| 6,422,078 B1 | 7/2002 | Imai |
| 6,423,563 B1 | 7/2002 | Fukada et al. |
| 6,424,074 B1 | 7/2002 | Nguyen |
| 6,429,506 B1 | 8/2002 | Fujii et al. |
| 6,429,755 B1 | 8/2002 | Speidell et al. |
| 6,433,401 B1 | 8/2002 | Clark et al. |
| 6,433,411 B1 | 8/2002 | Degani et al. |
| 6,437,551 B1 | 8/2002 | Krulevitch et al. |
| 6,440,766 B1 | 8/2002 | Clark |
| 6,441,481 B1 | 8/2002 | Karpman |
| 6,443,008 B1 | 9/2002 | Funk et al. |
| 6,444,543 B1 | 9/2002 | Sakai et al. |
| 6,448,109 B1 | 9/2002 | Karpman |
| 6,448,604 B1 | 9/2002 | Funk et al. |
| 6,448,622 B1 | 9/2002 | Franke et al. |
| 6,449,406 B1 | 9/2002 | Fan et al. |
| 6,460,234 B1 | 10/2002 | Gianchandani |
| 6,462,566 B1 | 10/2002 | Schoefthaler et al. |
| 6,463,803 B1 | 10/2002 | Fujii et al. |
| 6,465,281 B1 | 10/2002 | Xu et al. |
| 6,472,290 B1 | 10/2002 | Cho et al. |
| 6,477,901 B1 | 11/2002 | Tadigadapa et al. |
| 6,478,974 B1 | 11/2002 | Lebouitz et al. |
| 6,483,957 B1 | 11/2002 | Hamerly et al. |
| 6,495,389 B1 | 12/2002 | Ishio et al. |

| | | | |
|---|---|---|---|
| 6,507,044 B1 | 1/2003 | Santana, Jr. et al. | |
| 6,507,082 B1 | 1/2003 | Thomas | |
| 6,508,124 B1 | 1/2003 | Zerbini et al. | |
| 6,508,126 B1 | 1/2003 | Sakai et al. | |
| 6,508,561 B1 | 1/2003 | Alie et al. | |
| 6,512,255 B1 | 1/2003 | Aoki et al. | |
| 6,521,508 B1 | 2/2003 | Cheong et al. | |
| 6,521,965 B1 | 2/2003 | Lutz | |
| 6,522,052 B1 | 2/2003 | Kihara et al. | |
| 6,524,890 B1 | 2/2003 | Ueda et al. | |
| 6,531,767 B1 | 3/2003 | Shrauger | |
| 6,534,340 B1 | 3/2003 | Karpman et al. | |
| 6,550,331 B1 | 4/2003 | Fujii et al. | |
| 6,550,339 B1 | 4/2003 | Toyoda et al. | |
| 6,551,853 B1 | 4/2003 | Toyoda | |
| 6,552,404 B1 | 4/2003 | Hynes et al. | |
| 6,555,417 B1 | 4/2003 | Spooner et al. | |
| 6,555,901 B1 | 4/2003 | Yoshihara et al. | |
| 6,555,904 B1 | 4/2003 | Karpman | |
| 6,558,976 B1 | 5/2003 | Shrauger | |
| 6,621,134 B1 | 9/2003 | Zurn | |
| 6,624,726 B1 | 9/2003 | Niu et al. | |
| 6,635,509 B1 | 10/2003 | Ouellet | |
| 6,808,954 B1 | 10/2004 | Ma et al. | |
| 2001/0001931 A1 | 5/2001 | Fujii et al. | |
| 2001/0009110 A1 | 7/2001 | Tmai | |
| 2001/0034076 A1 | 10/2001 | Martin | |
| 2002/0016058 A1 | 2/2002 | Zhao | |
| 2002/0135047 A1 | 9/2002 | Funk et al. | |
| 2004/0016989 A1 | 1/2004 | Ma et al. | |
| 2004/0065932 A1* | 4/2004 | Reichenbach et al. | 257/415 |

FOREIGN PATENT DOCUMENTS

| | | |
|---|---|---|
| EP | 1 217 735 | 6/2002 |
| GB | 2 198 611 | 6/1988 |
| WO | WO 97/49475 | 12/1997 |
| WO | WO 01/46066 | 6/2001 |
| WO | WO 01/77008 | 10/2001 |
| WO | WO 01/77009 | 10/2001 |

OTHER PUBLICATIONS

"Vacuum Sealing of Microcavities Using Metal Evaporation", Bartek et al., Sensors and Actuators A 61, 1997, pp. 364-368.

"Vacuum Packaging Technology Using Localized Aluminum/Silicon-to-Glass Bonding", Cheng et al., MEMS 2001, 14$^{th}$ IEEE International Conference, pp. 18-21.

"A Hermetic Glass-Silicon Package Formed Using Localized Aluminum/Silicon-Glass Bonding", Cheng et al., Journal of Microelectromechanical Systems, vol. 10, No. 3, Sep. 2001, pp. 392-399.

"MEMS Post-Packaging by Localized Heating Bonding", Lin, IEEE Transactions on Advanced Packaging, vol. 23, No. 4, Nov. 2000, pp. 608-616.

"Localized Silicon Fusion and Eutectic Bonding for MEMS Fabrication and Packaging", Cheng et al., Journal of Microelectromechanical Systems, vol. 9, No. 1, Mar. 2000, pp. 3-8.

"Localized Bonding with PSG or Indium Solder as Intermediate Layer", Cheng et al., MEMS 1999, 12$^{th}$ IEEE International Conference, pp. 285-289.

"Vacuum encapsulation of resonant devices using permeable polysilicon", Lebouitz et al., Micro Electro Mechanical Systems, IEEE International Conference, Jan. 1999, pp. 470-475.

"Electrical and optical characteristics of vacuum-sealed polysilicon microlamps", Mastrangelo et al., IEEE Transactions on Electron Devices, v.39, No. 6, Jun. 1992, pp. 1363-1375.

"Vacuum-sealed silicon micromachined incandescent light source", Mastrangelo et al., IEDM, 1989, pp. 503-506.

"Sealing of Micromachined Cavities Using Chemical Vapor Deposition Methods: Characterization and Optimization", Liu and Tai, IEEE Journal of Microelectromechanical Systems, vol. 8, No. 2, Jun. 1999, pp. 135-145.

"Vacuum Packaging Technology Using Localized Aluminum/Silicon-to-Glass Bonding", Cheng et al., IEEE Journal of Microelectromechanical Systems, vol. 11, No. 5, Oct. 2002, pp. 556-565.

"Novel Process for a Monolithic Integrated Accelerometer", Offenberg et al., The 8$^{th}$ International Conference on Solid-State Sensors and Actuators, and Eurosensors IX, Stockholm, Sweden, Jun. 25-29, 1995, pp. 589-592.

"An Integrated Wafer-Scale Packaging Process for MEMS", Kenny et al., Proceedings of IMECE2002, ASME International Mechanical Engineering Congress & Exposition, Nov. 17-22, 2002, New Orleans, Louisiana, pp. 51-54.

"Polysilicon Vibrating Gyroscope Vacuum-Encapsulated in an on-chip Micro Chamber", Tsuchiya et al., Sensors and Actuators A 90 (2001), pp. 49-55.

"New Thin Film Epitaxial Polysilicon Encapsulation for Piezoresistive Accelerometers", Partridge et al., IEEE, 2001, pp. 54-59.

"A Low Temperature Bi-CMOS Compatible Process for MEMS RF Resonators and Filters", Lund et al., Solid-State Sensor, Actuator and Microsystems Workshop, Hilton Head Island, South Carolina, Jun. 2-6, 2002, pp. 38-41.

"Permeable Polysilicon Etch-Access Windows for Microshell Fabrication", Lebouitz K S et al., International Conference on Solid-State Sensors and Actuators and Eurosensors, Jun. 25, 1995 (Jun. 25, 1996), pp. 224-227.

"Porous Polycrystaline Silicon: A New Material for MEMS", Anderson R C et al., Journal of Microelectromechanical Systems, Mar. 1994, USA, vol. 3, No. 1, pp. 10-18.

"Vacuum Encapsulation of Resonant Devices Using Permeable Polysilicon", Lebouitz et al., 1999 IEEE, pp. 470-475.

"Laterally Grown Porous Polycrystalline Silicon: A New Material for Transducer Applications", Anderson et al., 1991 IEEE, pp. 747-750.

* cited by examiner

MICROELECTROMECHANICAL SYSTEMS AND DEVICES HAVING THIN FILM ENCAPSULATED MECHANICAL STRUCTURES

BACKGROUND

This invention relates to electromechanical systems and techniques for fabricating microelectromechanical and nanoelectromechanical systems; and more particularly, in one aspect, to fabricating or manufacturing microelectromechanical and nanoelectromechanical systems with high performance integrated circuits on a common substrate.

Microelectromechanical systems ("MEMS"), for example, gyroscopes, resonators and accelerometers, utilize micromachining techniques (i.e., lithographic and other precision fabrication techniques) to reduce mechanical components to a scale that is generally comparable to microelectronics. MEMS typically include a mechanical structure fabricated from or on, for example, a silicon substrate using micromachining techniques.

The mechanical structures are typically sealed in a chamber. The delicate mechanical structure may be sealed in, for example, a hermetically sealed metal container (for example, a TO-8 "can", see, for example, U.S. Pat. No. 6,307,815) or bonded to a semiconductor or glass-like substrate having a chamber to house, accommodate or cover the mechanical structure (see, for example, U.S. Pat. Nos. 6,146,917; 6,352,935; 6,477,901; and 6,507,082). In the context of the hermetically sealed metal container, the substrate on, or in which, the mechanical structure resides may be disposed in and affixed to the metal container. The hermetically sealed metal container also serves as a primary package as well.

In the context of the semiconductor or glass-like substrate packaging technique, the substrate of the mechanical structure may be bonded to another substrate whereby the bonded substrates form a chamber within which the mechanical structure resides. In this way, the operating environment of the mechanical structure may be controlled and the structure itself protected from, for example, inadvertent contact. The two bonded substrates may or may not be the primary package for the MEMS as well.

MEMS that employ a hermetically sealed metal container or a bonded semiconductor or glass-like substrate to protect the mechanical structures tend to be difficult to cost effectively integrate with high performance integrated circuitry on the same substrate. In this regard, the additional processing required to integrate the high performance integrated circuitry, tends to either damage or destroy the mechanical structures.

Another technique for forming the chamber that protects the delicate mechanical structure employs micromachining techniques. (See, for example, International Published Patent Applications Nos. WO 01/77008 A1 and WO 01/77009 A1). In this regard, the mechanical structure is encapsulated in a chamber using a conventional oxide (SiO$_2$) deposited or formed using conventional techniques (i.e., oxidation using low temperature techniques (LTO), tetraethoxysilane (TEOS) or the like). (See, for example, WO 01/77008 A1, FIGS. 2–4). When implementing this technique, the mechanical structure is encapsulated prior to packaging and/or integration with integrated circuitry.

While employing a conventional oxide to encapsulate the mechanical structures of the MEMS may provide advantages relative to hermetically sealed metal container or a bonded semiconductor or glass-like substrate, a conventional oxide, deposited using conventional techniques, often exhibits high tensile stress at, for example, corners or steps (i.e., significant spatial transitions in the underlying surface(s)). Further, such an oxide is often formed or deposited in a manner that provides poor coverage of those areas where the underlying surface(s) exhibit significant spatial transitions. In addition, a conventional oxide (deposited using conventional techniques) often provides an insufficient vacuum where a vacuum is desired as the environment in which the mechanical structures are encapsulated and designed to operate. These shortcomings may impact the integrity and/or performance of the MEMS.

Moreover, a conventional oxide, deposited using conventional techniques, may produce a film on the mechanical structures during the encapsulation process. This film may impact the integrity of the mechanical structures and, as such, the performance or operating characteristics of the MEMS (for example, the operating characteristics of a resonator).

There is a need for, among other things, MEMS (for example, gyroscopes, resonators, temperature sensors and/or accelerometers) that (1) overcome one, some or all of the shortcomings of the conventional materials and techniques and/or (2) may be efficiently integrated on a common substrate with high performance integrated circuits and/or additional MEMS.

SUMMARY OF THE INVENTION

There are many inventions described and illustrated herein. In a first principal aspect, the present invention is a method of sealing a chamber of an electromechanical device having a mechanical structure disposed within the chamber. The method includes depositing a sacrificial layer over at least a portion of the mechanical structure and depositing a first encapsulation layer (for example, a polycrystalline silicon, amorphous silicon, germanium, silicon/germanium or gallium arsenide) over the sacrificial layer. At least one vent is formed through the first encapsulation layer, and at least a portion of the sacrificial layer is removed to form the chamber. Thereafter, a second encapsulation layer is deposited over or in the vent to seal the chamber wherein the second encapsulation layer is a semiconductor material (for example, polycrystalline silicon, amorphous silicon, silicon carbide, silicon/germanium, germanium, or gallium arsenide).

In one embodiment of this aspect of the invention, the first encapsulation layer is a semiconductor material that is doped with a first impurity to provide a first region of a first conductivity type, and the second encapsulation layer is doped with a second impurity to provide a second region with a second conductivity type. The first conductivity type is opposite the second conductivity type. In one embodiment, the first and second encapsulation layers are deposited using an epitaxial or a CVD reactor.

The method may also include planarizing an exposed surface of the second encapsulation layer and removing a sufficient amount of the second encapsulation layer to thereby expose the first encapsulation layer and provide junction isolation.

In one embodiment, a first portion of the first encapsulation layer is comprised of a monocrystalline silicon and a second portion is comprised of a polycrystalline silicon. In this embodiment, a surface of the second encapsulation layer may be planarized to expose the first portion of the first encapsulation. Thereafter, a monocrystalline silicon may be grown on the first portion of the first encapsulation.

In another principal aspect, the present invention is a method of manufacturing an electromechanical device having a mechanical structure that resides in a chamber. The chamber may include a fluid having a pressure that provides mechanical damping for the mechanical structure. The method comprises depositing a first encapsulation layer (comprised of a semiconductor material, for example, polycrystalline silicon, amorphous silicon, silicon carbide, silicon/germanium, germanium, or gallium arsenide) over the mechanical structure. At least one vent is then formed in the first encapsulation layer and the chamber is formed. Thereafter, a second encapsulation layer (comprised of a semiconductor material, for example, polycrystalline silicon, porous polycrystalline silicon, amorphous silicon, silicon carbide, silicon/germanium, germanium, or gallium arsenide) is deposited over or in the vent to seal the chamber.

In one embodiment of this aspect of the invention, the first encapsulation layer is doped with a first impurity to provide a first region of a first conductivity type, and the second encapsulation layer is doped with a second impurity to provide a second region with a second conductivity type. The first conductivity type is opposite the second conductivity type. The first and second encapsulation layers may be deposited using an epitaxial or a CVD reactor.

In one embodiment, a first portion of the first encapsulation layer is comprised of a monocrystalline silicon and a second portion is comprised of a polycrystalline silicon. In this embodiment, a surface of the second encapsulation layer may be planarized to expose the first portion of the first encapsulation. Thereafter, a monocrystalline silicon may be grown on the first portion of the first encapsulation.

In another principal aspect, the present invention is an electromechanical device comprising a chamber including a first encapsulation layer (for example, polycrystalline silicon, porous polycrystalline silicon, amorphous silicon, germanium, silicon/germanium, gallium arsenide, silicon nitride or silicon carbide), having at least one vent, and a mechanical structure having at least a portion disposed in the chamber. The electromechanical device also includes a second encapsulation layer comprised of a semiconductor material (for example, polycrystalline silicon, porous polycrystalline silicon, amorphous silicon, silicon carbide, silicon/germanium, germanium, or gallium arsenide), deposited over or in the vent, to thereby seal the chamber.

In one embodiment, the first encapsulation layer is a semiconductor material that is doped with a first impurity to provide a first region of a first conductivity type. The second encapsulation layer is doped with a second impurity to provide a second region with a second conductivity type. The first conductivity type is opposite the second conductivity type.

The device may also include a contact (i.e., a conductive region, such as the contact area and/or contact via, that is partially or wholly disposed outside of the chamber) disposed outside the chamber. The contact may be a semiconductor that is doped with impurities to increase the conductivity of the area. The contact may be surrounded by the semiconductor of the first conductivity type and the semiconductor of the second conductivity type, which, in combination, forms a junction isolation.

The device of this aspect of the present invention may include a first portion of the first encapsulation layer that is comprised of a monocrystalline silicon and a second portion is comprised of a polycrystalline silicon. In addition, the present invention may include a field region disposed outside and above the chamber wherein the field region is comprised of a monocrystalline silicon.

In one embodiment, the first portion of the first encapsulation layer may be comprised of a monocrystalline silicon and a second portion comprised of a porous or amorphous silicon. In this embodiment, the second encapsulation layer overlying the second portion of the first encapsulation layer is a polycrystalline silicon.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

DETAILED DESCRIPTION

There are many inventions described and illustrated herein. In one aspect, the present invention is directed to a MEMS device, and technique of fabricating or manufacturing a MEMS device, having mechanical structures encapsulated in a chamber prior to final packaging and/or completion of the device. The material that encapsulates the mechanical structures may include one or more of the following attributes: low tensile stress, good step coverage, maintains integrity when subjected to subsequent processing, does not significantly and/or adversely affect the performance characteristics of the mechanical structures (if coated with the material during its deposition, formation and/or growth) within the chamber, maintains designed, appropriate and/or suitable encapsulation attributes over operating conditions and/or time, and/or facilitates integration with high-performance integrated circuits. In one embodiment, the mechanical structures are encapsulated by a semiconductor material, for example, silicon (for example, monocrystalline silicon, polycrystalline silicon, amorphous silicon or porous polycrystalline silicon, whether doped or undoped), germanium, silicon-germanium, silicon carbide or gallium arsenide, or combinations thereof. Such materials may maintain one or more of the following attributes over typical operating conditions and the lifetime of the MEMS.

Figure 1:
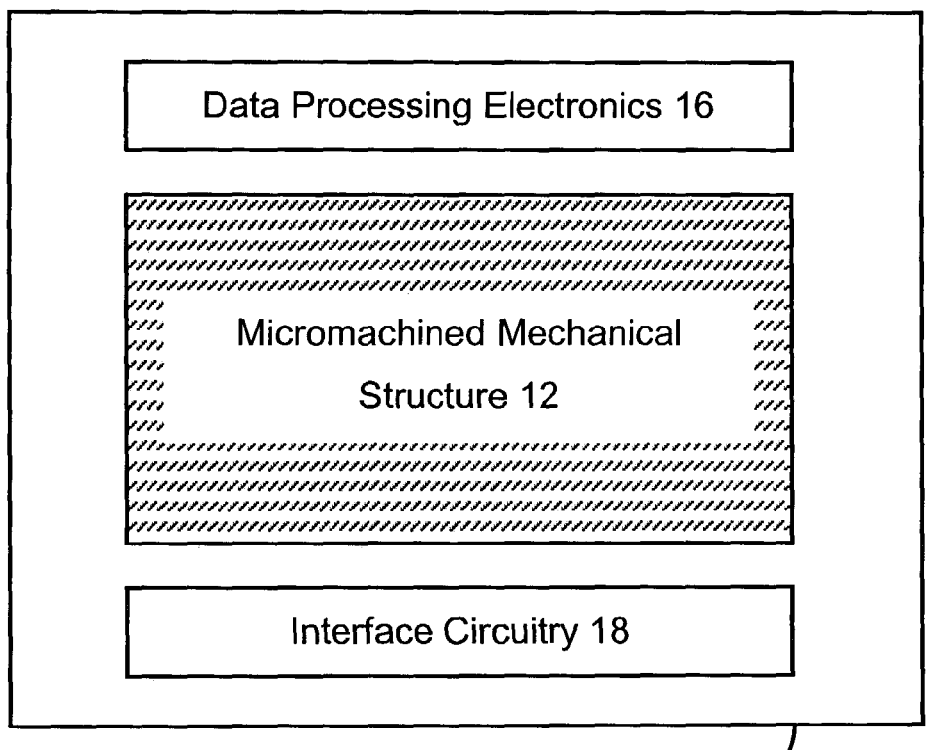
FIG. 1 is a block diagram of microelectromechanical system disposed on a substrate, in conjunction with interface circuitry and data processing electronics.

With reference to FIG. 1, in one exemplary embodiment, a MEMS 10 includes a micromachined mechanical structure 12 that is disposed on substrate 14, for example, an undoped semiconductor-like material, a glass-like material, or an insulator-like material. The MEMS 10 may also include data processing electronics 16, to process and analyze information generated by, and/or control or monitor the micromachined mechanical structure 12. In addition, MEMS 10 may also include interface circuitry 18 to provide the information from micromachined mechanical structure 12 and/or data processing electronics 16 to an external device (not illustrated), for example, a computer, indicator/display and/or sensor.

The data processing electronics 16 and/or interface circuitry 18 may be integrated in or on substrate 14. In this regard, MEMS 10 may be a monolithic structure including mechanical structure 12, data processing electronics 16 and interface circuitry 18. The data processing electronics 16 and/or interface circuitry 18 may also reside on a separate, discrete substrate that, after fabrication, is bonded to or on substrate 14.

Figure 2:
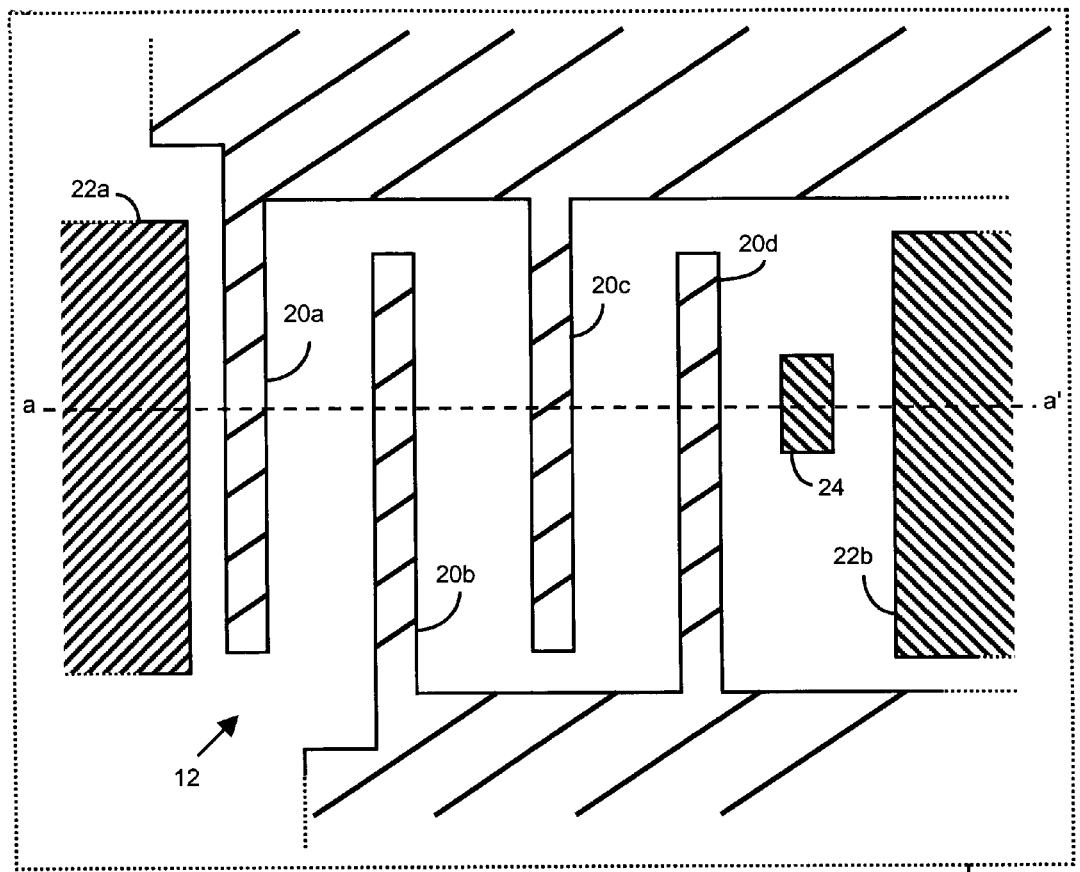
FIG. 2 illustrates a top view of a portion of micromechanical structure, for example, or portion of the interdigitated or comb-like finger electrode arrays of an accelerometer, in conjunction with a contact area and field regions.

With reference to FIG. 2, in one embodiment, micromachined mechanical structure 12 includes mechanical structures 20a–d disposed on, above and/or in substrate 14. The mechanical structures 20a–20d may be comprised of, for example, materials in column IV of the periodic table, for example silicon, germanium, carbon; also combinations of these, for example silicon germanium, or silicon carbide; also of III-V compounds for example gallium phosphide, aluminum gallium phosphide, or other III-V combinations; also combinations of III, IV, V, or VI materials, for example silicon nitride, silicon oxide, aluminum carbide, or aluminum oxide; also metallic silicides, germanides, and carbides, for example nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Moreover, the micromachined mechanical structure 12 may be an accelerometer, gyroscope or other transducer (for example, pressure sensor, strain sensor, tactile sensor, magnetic sensor and/or temperature sensor), or resonator. The micromachined mechanical structure 12 may also include mechanical structures of a plurality of transducers or sensors including one or more accelerometers, gyroscopes, pressure sensors, tactile sensors and temperature sensors. Where micromachined mechanical structure 12 is an accelerometer, mechanical structures 20a–d may be a portion of the interdigitated or comb-like finger electrode arrays that comprise the sensing features of the accelerometer (See, for example, U.S. Pat. No. 6,122,964).

With continued reference to FIG. 2, field regions 22a and 22b and contact area 24 are also disposed on or in substrate 14. The field regions 22 may provide a substrate material for the electronic or electrical components or integrated circuits (for example, transistors, resistors, capacitors, inductors and other passive or active elements) of data processing electronics 16 and/or interface circuitry 18. The contact area 24 may provide an electrical path between micromachined mechanical structure 12 and data processing electronics 16, interface circuitry 18 and/or an external device (not illustrated). The field regions 22 and contact area 24 may be comprised of, for example, silicon, (whether doped or undoped), germanium, silicon/germanium, silicon carbide, and gallium arsenide.

Figure 3:
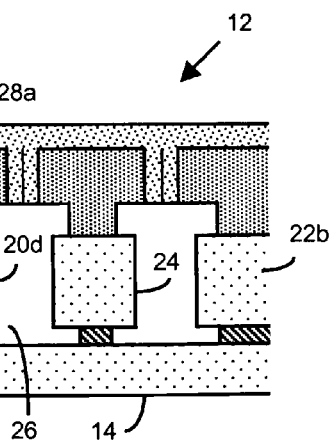
FIG. 3 illustrates a cross-sectional view (sectioned along dotted line a—a of FIG. 2) of the portion of the interdigitated or comb-like finger electrode array and contact area and field regions of FIG. 2, in accordance with certain aspects of the present invention.

FIG. 3 illustrates a cross-sectional view of micromachined mechanical structure 12, including mechanical structures 20a–d, along dotted line a–a', in accordance with one embodiment of the present invention. The mechanical structures 20a–d are disposed within chamber 26. In one embodiment, chamber 26 is sealed or encapsulated via encapsulating layers 28a and 28b.

The encapsulating layers 28a and 28b may be comprised of, for example, a semiconductor. In one embodiment, encapsulating layers 28a and 28b may contain silicon (for example, monocrystalline silicon, polycrystalline silicon, amorphous silicon or porous polycrystalline silicon, whether doped or undoped), germanium, silicon/germanium, silicon carbide, and gallium arsenide (and combinations thereof. The encapsulating layers 28a and 28b may be the same materials or different materials.

The encapsulating layers 28a and 28b may be deposited, formed and/or grown using the same or different techniques. For example, encapsulating layer 28a may be a polycrystalline silicon deposited using a low pressure ("LP") chemically vapor deposited ("CVD") process (in a tube or EPI reactor) or plasma enhanced ("PE") CVD process and encapsulating layer 28b may be a doped polycrystalline silicon deposited using an atmospheric pressure ("AP") CVD process. Alternatively, for example, encapsulating layer 28a may be a silicon germanium deposited using a LPCVD process and encapsulating layer 28b may be doped polycrystalline silicon deposited using a PECVD process. Indeed, all semiconductor materials and deposition techniques, and permutations thereof, for encapsulating chamber 26, whether now known or later developed, are intended to be within the scope of the present invention.

It should be noted that the mechanical structures of one or more transducers or sensors (for example, accelerometers, gyroscopes, pressure sensors, tactile sensors and/or temperature sensors) may be contained or reside in a single chamber and exposed to an environment within that chamber. Under this circumstance, the environment contained in chamber 26 provides a mechanical damping for the mechanical structures of one or more micromachined mechanical structures (for example, an accelerometer, a pressure sensor, a tactile sensor and/or temperature sensor).

Moreover, the mechanical structures of the one or more transducers or sensors may themselves include multiple layers that are vertically and/or laterally stacked or interconnected. (See, for example, micromachined mechanical structure 12b of FIG. 11A; mechanical structure 12 of FIGS. 11B and 11C; and mechanical structures 20a and 20b, contact areas 24a and 24b, and buried contacts 24' and 24" of FIG. 11D). Thus, under this circumstance, the mechanical structures are fabricated using one or more processing steps to provide the vertically and/or laterally stacked and/or interconnected multiple layers.

Figure 4A:
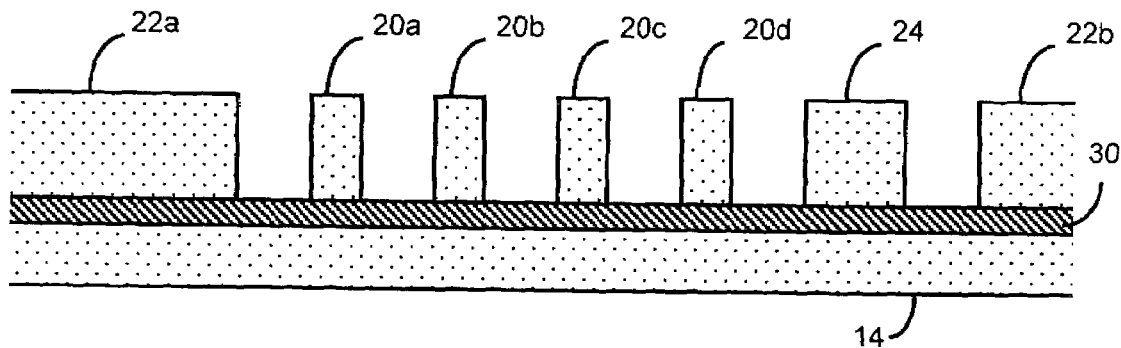
FIGS. 4A–4G illustrate cross-sectional views of the fabrication of the microstructure of FIG. 3 at various stages of the process, according to certain aspects of the present invention.
Figure 4B:
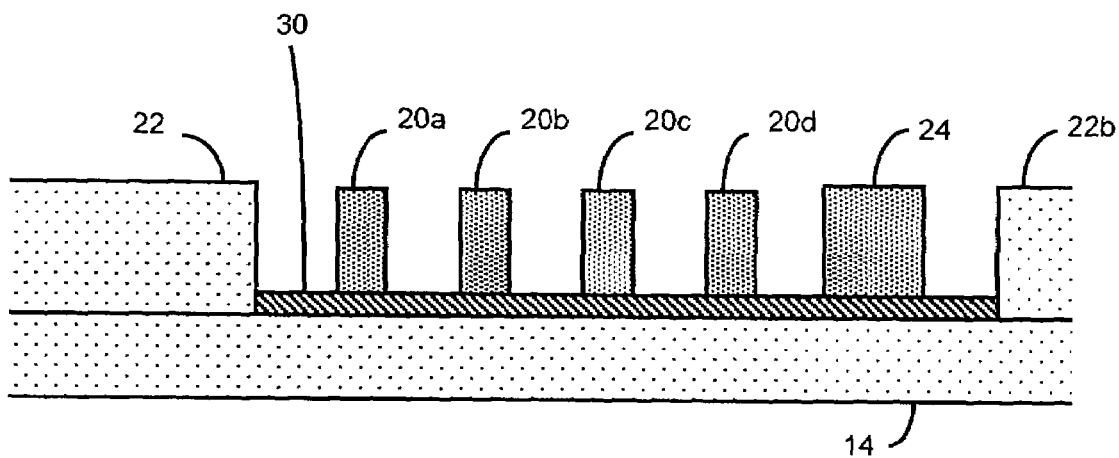

With reference to FIGS. 4A and 4B, an exemplary method of fabricating or manufacturing a micromachined mechanical structure 12 may begin with a partially formed device including mechanical structures 20a–d and contact area 24 disposed on first sacrificial layer 30, for example, silicon dioxide or silicon nitride. Mechanical structures 20a–d and contact area 24 may be formed using well-known deposition, lithographic, etching and/or doping techniques as well as from well-known materials (for example, semiconductors such as silicon, germanium, silicon-germanium or gallium-arsenide). Moreover, field regions 22a and 22b and first sacrificial layer 30 may be formed using well-known silicon-on-insulator fabrication techniques (FIG. 4A) or well-known formation, lithographic, etching and/or deposition techniques using a standard or over-sized ("thick") wafer (FIG. 4B). Notably, field regions 22a and 22b, mechanical structures 20 and contact area 24 may be comprised of single or monocrystalline structures (for example, monocrystalline silicon) as illustrated in FIG. 4A, polycrystalline structures, or both monocrystalline and polycrystalline structures as illustrated in FIG. 4B (i.e., field regions 22a and 22b are comprised of single or monocrystalline structures, for example, monocrystalline silicon, and mechanical structures 20 and contact area 24 may be comprised of polycrystalline structures, for example, polycrystalline silicon. Indeed, all techniques, materials and crystal structures for creating a partially formed device including mechanical structures 20a–d and contact area 24 disposed on first sacrificial layer 30, whether now known or later developed, are intended to be within the scope of the present invention.

Figure 4C:
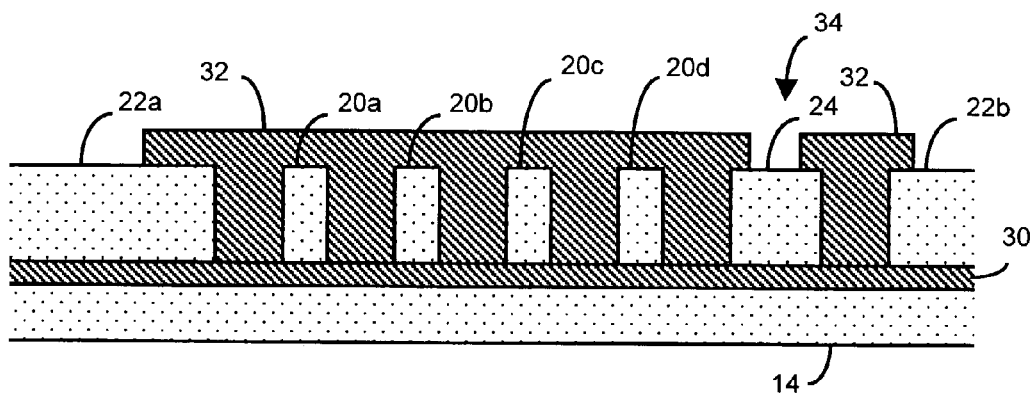

With reference to FIG. 4C, following formation of mechanical structures 20a–d and contact area 24, a second sacrificial layer 32, for example, silicon dioxide or silicon nitride, may be deposited and/or formed to secure, space and/or protect mechanical structures 20a–d during subsequent processing, including the encapsulation process. In addition, an opening 34 may be etched or formed into second sacrificial layer 32 to provide for subsequent formation of an electrical contact. The opening 34 may be provided using, for example, well known masking techniques (such as a nitride mask) prior to and during deposition and/or formation of second sacrificial layer 32, and/or well known lithographic and etching techniques after deposition and/or formation of second sacrificial layer 32.

Figure 4D:
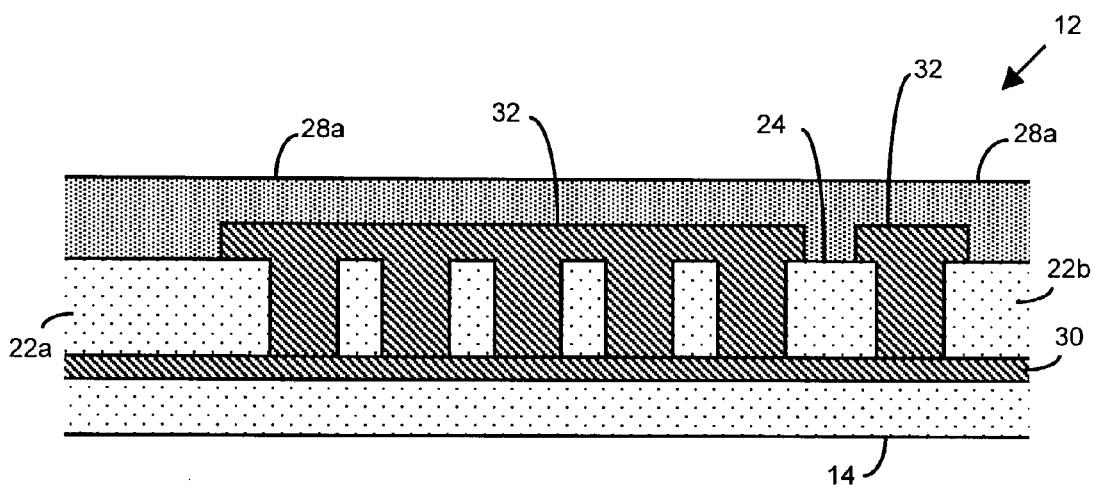
Figure 4E:
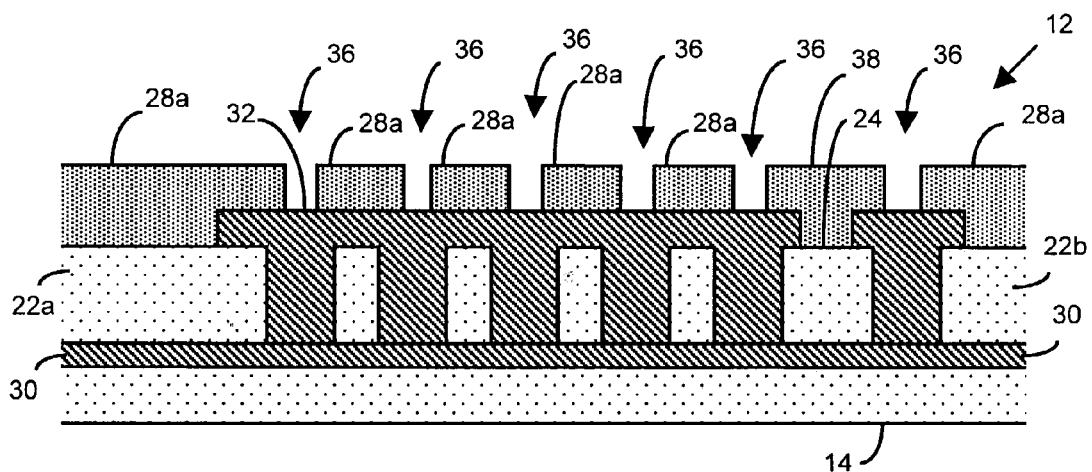
Figure 4F:
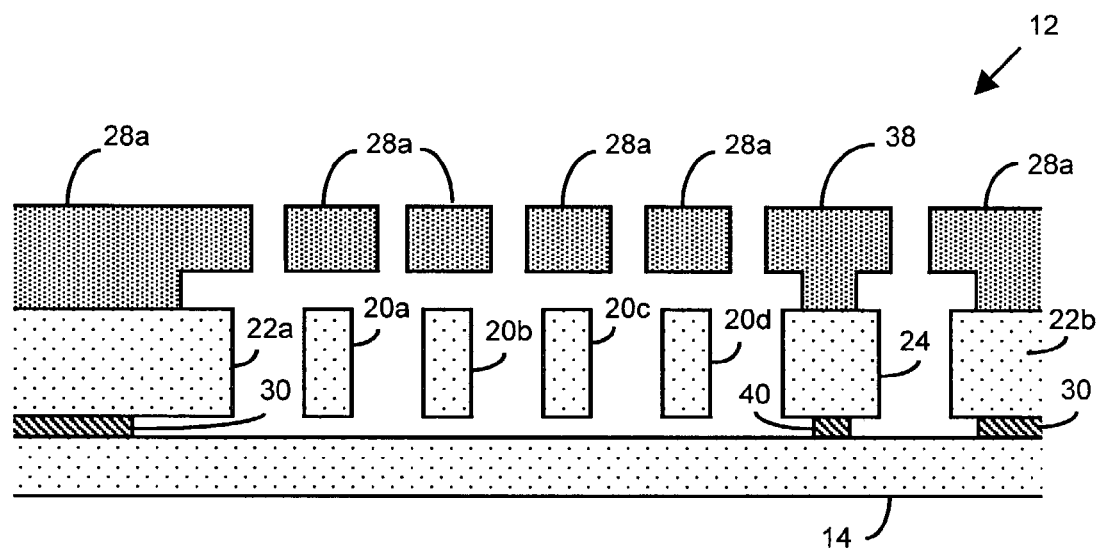

With reference to FIGS. 4D, 4E and 4F, thereafter, first encapsulation layer 28a may be deposited, formed and/or grown on second sacrificial layer 32 (see, FIG. 4D). In one embodiment, the thickness of first encapsulation layer 28a in the region overlying second sacrificial layer 32 may be between 1 μm and 25 μm. The external environmental stress on, and internal stress of first encapsulation layer 28a after etching second sacrificial layer 32 may impact the thickness of first encapsulation layer 28a. Slightly tensile films may self-support better than compressive films which may buckle.

The first encapsulation layer 28a may be etched to form passages or vents 36 (see, FIG. 4E). In one exemplary embodiment, the vents have a diameter or aperture size of between 0.1 μm to 2 μm.

The vents 36 are intended to permit etching and/or removal of at least selected portions of first and second sacrificial layers 30 and 32, respectively (see, FIG. 4F). For example, in one embodiment, where first and second sacrificial layers 30 and 32 are comprised of silicon dioxide, selected portions of layers 32 and 32 may be removed/etched using well known wet etching techniques and buffered HF mixtures (i.e., a buffered oxide etch) or well known vapor etching techniques using vapor HF. Proper design of mechanical structures 20a–d and sacrificial layers 30 and 32, and control of the HF etching process parameters may permit the sacrificial layer 30 to be sufficiently etched to remove all or substantially all of layer 30 around mechanical elements 20a–d and thereby release elements 20a–d to permit proper operation of MEMS 10.

In another embodiment, where first and second sacrificial layers 30 and 32 are comprised of silicon nitride, selected portions of layers 30 and 32 may be removed/etched using phosphoric acid. Again, proper design of mechanical structures 20a–d and sacrificial layers 30 and 32, and control of the wet etching process parameters may permit the sacrificial layer 30 to be sufficiently etched to remove all or substantially all of sacrificial layer 30 around mechanical elements 20a–d which will release mechanical elements 20a–d.

It should be noted that there are: (1) many suitable materials for layers 30 and/or 32 (for example, silicon dioxide, silicon nitride, and doped and undoped glass-like materials, e.g., phosphosilicate ("PSG") or borophosphosilicate ("BPSG")) and spin on glass ("SOG")), (2) many suitable/associated etchants (for example, a buffered oxide etch, phosphoric acid, and alkali hydroxides such as, for example, NaOH and KOH), and (3) many suitable etching or removal techniques (for example, wet, plasma, vapor or dry etching), to eliminate, remove and/or etch sacrificial layers 30 and/or 32. Indeed, layers 30 and/or 32 may be a doped or undoped semiconductor (for example, polycrystalline silicon, silicon/germanium or germanium) in those instances where mechanical structures 20a–d and contact area 24 are the same or similar semiconductors (i.e., processed, etched or removed similarly) provided that mechanical structures 20a–d and contact area 24 are not adversely affected by the etching or removal processes (for example, where structures 20a–d and area 24 are "protected" during the etch or removal process (e.g., an oxide layer protecting a silicon based structures 20a–d) or where structures 20a–d and contact area 24 are comprised of a material that is adversely affected by the etching or removal process of layers 30 and/or 32). Accordingly, all materials, etchants and etch techniques, and permutations thereof, for eliminating, removing and/or etching, whether now known or later developed, are intended to be within the scope of the present invention.

It should be further noted that, in certain embodiments, in addition to forming vents 36, the etching process of first encapsulation layer 28a also forms contact via 38 (see, FIG. 4F) to facilitate electrical continuity from electrical contact area 24 to a level to or above first encapsulation layer 28a. In this way, additional processing may be avoided, eliminated and/or minimized, for example, processing related to removal of the portion of first encapsulation layer 28a overlying electrical contact area 24 and deposition, formation and/or growth of a suitable material (to provide adequate electrical contact between the various layers of MEMS 10, for example, monocrystalline silicon). Indeed, the resistivity or conductivity of contact via 38 may be adjusted (for example, resistivity reduced and/or conductivity enhanced) using well-known impurity implantation techniques.

Moreover, contact 24 may remain partially, substantially or entirely surrounded by first and second sacrificial layers 30 and/or 32. For example, with reference to FIG. 4F, while mechanical structures 20a–d are released from their respective underlying oxide columns, a column 40 of sacrificial layer 30 beneath or underlying electrical contact area 24 may provide additional physical support as well as electrical isolation for electrical contact area 24.

Figure 4G:
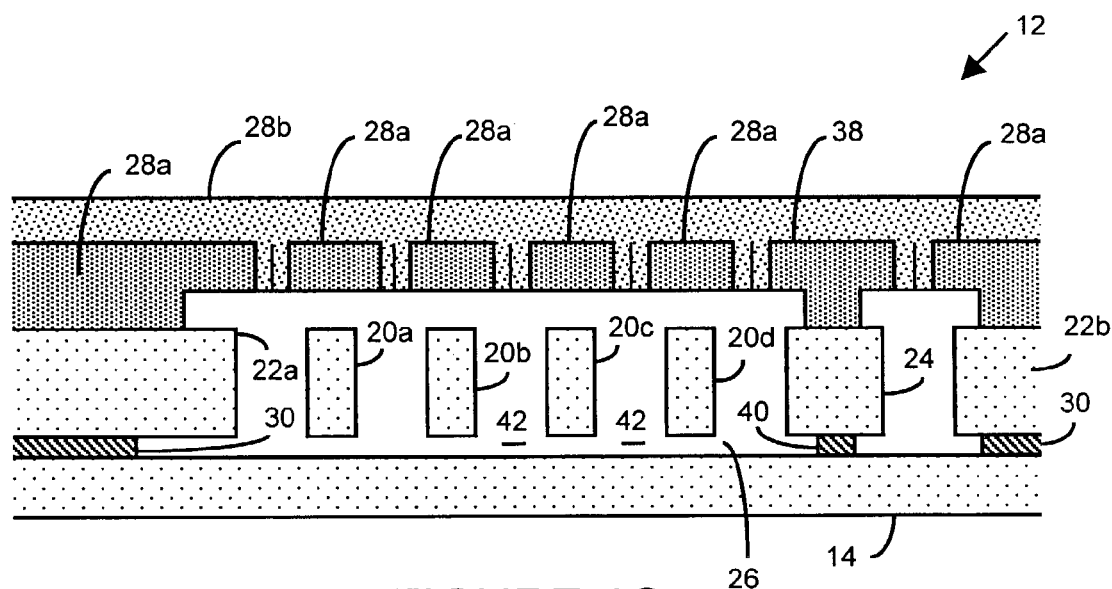

With reference to FIG. 4G, after releasing mechanical elements 20a–d, a second encapsulation layer 28b may be deposited, formed and/or grown. The second encapsulation layer 28b may be, for example, a silicon-based material (for example, a polycrystalline silicon or silicon-germanium), which is deposited using, for example, an epitaxial, a sputtering or a CVD-based reactor (for example, APCVD, LPCVD, or PECVD). The deposition, formation and/or growth may be by a conformal process or non-conformal process. The material may be the same as or different from first encapsulation layer 28a. However, it may be advantageous to employ the same material to form first and second encapsulation layers 28a and 28b. In this way, for example, the thermal expansion rates are the same and the boundaries between layers 28a and 28b may enhance the "seal" of chamber 26.

In one embodiment, second encapsulation layer 28b may be epitaxially deposited using an epitaxy reactor and conditions similar to conventional selective epitaxial silicon growth. This may be in a silane, dichlorosilane, or trichlorosilane process with $H_2$, and/or HCI gases. These processes may typically be run from 600° C. to 1400° C.

In one embodiment, the thickness of second encapsulation layer 28b in the region overlying second first encapsulation layer and elements 20a–d may be between 1 μm and 10 μm. Indeed, as MEMS 10, including mechanical structure 12, scale over time and various and/or different materials are implemented, the suitable or necessary thicknesses of first encapsulation layer 28a, second encapsulation layer 28b and combination thereof are likely to change. As such, a ratio of about 1:1 to 1:10 between thicknesses of first encapsulation layer 28a and second encapsulation layer 28b may be advantageous. It is noted, however, that other ratios and thicknesses are clearly suitable (see, for example, FIGS. 7A, 7B, and 8A–E).

The second encapsulation layer 28b may doped with impurities having an opposite conductivity relative to the impurities in first encapsulation layer 28a. For example, first encapsulation layer 28a may be doped with boron and second encapsulation layer 28b may be doped with phosphorous. In this way, upon completion of the sealing or encapsulation process, junctions surrounding electrical contact area 24 are formed which electrically "isolate" contact area 24 from, for example, field region 22b.

It should be noted that portions of second encapsulation layer 28b are disposed near, next to and/or around contact area 24 may also be subjected to ion implantation after deposition, formation and/or growth. In that way, the electrical "isolation" may be increased or enhanced. In those instances where second encapsulation layer 28b is deposited and/or formed without impurity dopants, the ion implantation may provide primary, all or substantially all of the electrical isolation between contact area 24 and, for example, field region 22b. Indeed, in those instances where second encapsulation layer 28b extends over or between field regions (thereby providing electrical connection there between), the ion implantation of portions of second encapsulation layer 28b (whether doping or counter-doping of a doped second encapsulation layer 28b) that are disposed near, next to and/or around contact area 24 may provide all or substantially all of the electrical isolation between contact area 24 and, for example, field region 22b.

Figure 5A:
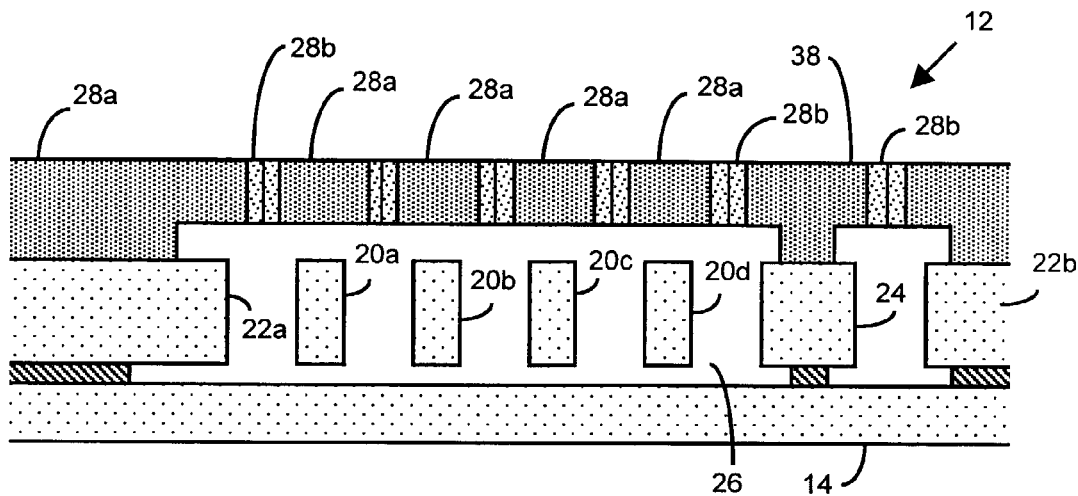
FIGS. 5A–5C illustrate cross-sectional views of additional fabrication processes of the microstructure of FIG. 3, according to certain aspects of the present invention.

With reference to FIG. 5A, in another set of embodiments, micromachined mechanical structure 12 may be substantially planarized using, for example, polishing techniques (for example, chemical mechanical polishing ("CMP")). In this regard, where second encapsulation layer 28b is deposited, formed and/or grown to a level that exceeds first encapsulation layer 28a (see, for example, FIG. 4G), the planarization process removes a portion of second encapsulation layer 28b to provide a "smooth" surface layer and/or (substantially) planar surface. It may be advantageous to remove a sufficient amount of second encapsulation layer 28b so that contact via 38 is electrically isolated by oppositely doped semiconductor layer 28b (See, FIG. 5A) relative to the first encapsulation layer 28a. This exposed planar surface may further provide a well-prepared base (in, for example, field regions 22) upon which integrated circuits (for example, CMOS transistors) and/or micromachined mechanical structure 12 may be fabricated on or in using well known fabrication techniques and equipment.

Figure 5B:
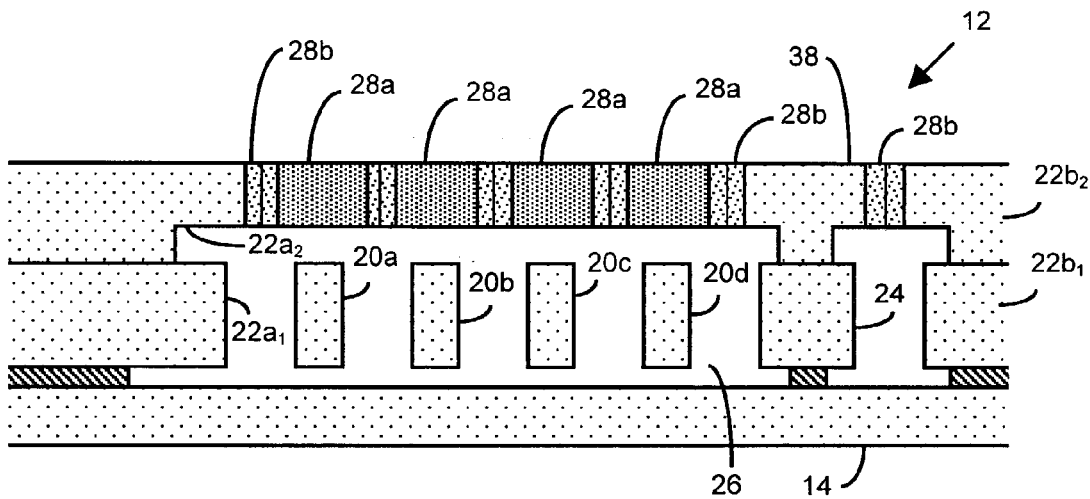
Figure 5C:
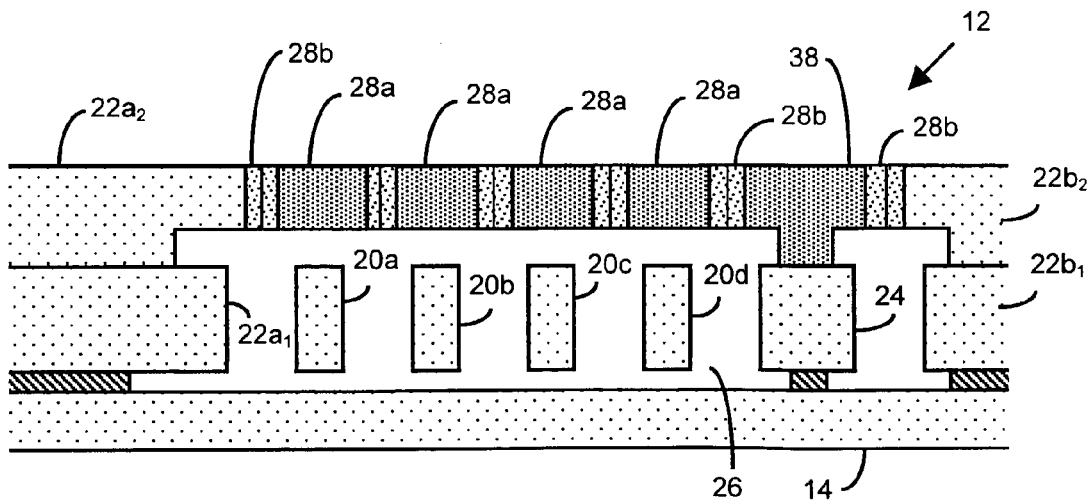

To facilitate integration of high performance integrated circuits in MEMS 10, it may be advantageous to include field regions 22a and/or 22b that are comprised of monocrystalline silicon in or on which such circuits may be fabricated. In this regard, with reference to FIG. 5B, in one embodiment, a portion of first encapsulation layer (i.e., $22a_2$ and $22b_2$) overlying field regions $22a_1$ and/or $22b_1$ may be recrystalized thereby "converting" or re-arranging the crystal structure of the polycrystalline material to that of a monocrystalline or substantially monocrystalline material. In this way, transistors or other components of, for example, data processing electronics 16, that are integrated in MEMS 10 may be fabricated in monocrystalline field regions.

In another embodiment, the portion of first encapsulation layer 28a overlying field regions $22a_1$ and/or $22b_1$ may be removed, using conventional etching techniques, to expose field regions $22a_1$ and/or $22b_1$. Thereafter, monocrystalline silicon may be grown on field regions $22a_1$ and/or $22b_1$ to thereby provide field regions $22a_2$ and/or $22b_2$.

In yet another embodiment, the portion of first encapsulation layer 28a overlying field regions $22a_1$ and/or $22b_1$ may be etched to expose field regions $22a_1$ and/or $22b_1$, which are comprised of monocrystalline silicon. Thereafter, transistors or other active components may be integrated in or on field regions 22a and/or 22b using well-known fabrication techniques.

With reference to FIGS. 6A–F, in another set of embodiments, the monocrystalline field regions $22a_2$ and $22b_2$ may be grown before, concurrently (simultaneously) or shortly after deposition, formation and/or growth of first encapsulation layer 28a. For example, with reference to FIG. 6A, before or after deposition or formation of second sacrificial layer 32, an epitaxially deposited encapsulation layer of monocrystalline silicon field regions $22a_2$ and $22b_2$ may be grown to a level that is above or exceeds second sacrificial layer 32. Alternatively, monocrystalline silicon field regions $22a_2$ and $22b_2$ are not grown to a level that is above or exceeds second sacrificial layer 32 (not illustrated).

Figure 6A:
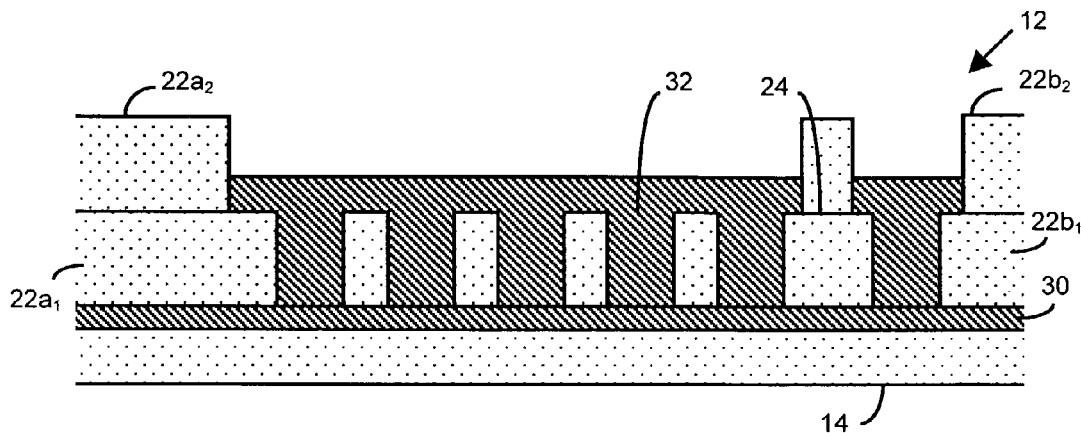
FIGS. 6A–6F illustrate cross-sectional views of the fabrication of the microstructure, according to certain aspects of the present invention, at various stages of the process.
Figure 6B:
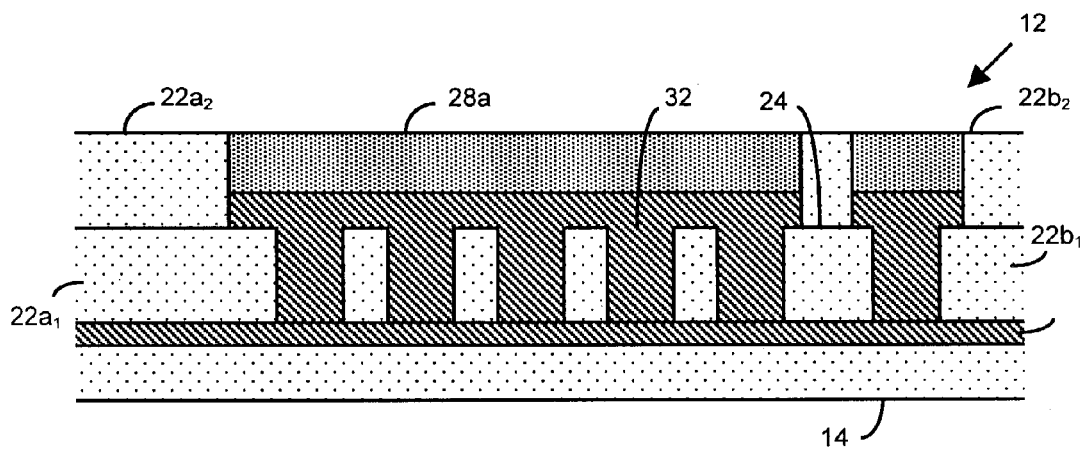
Figure 6C:
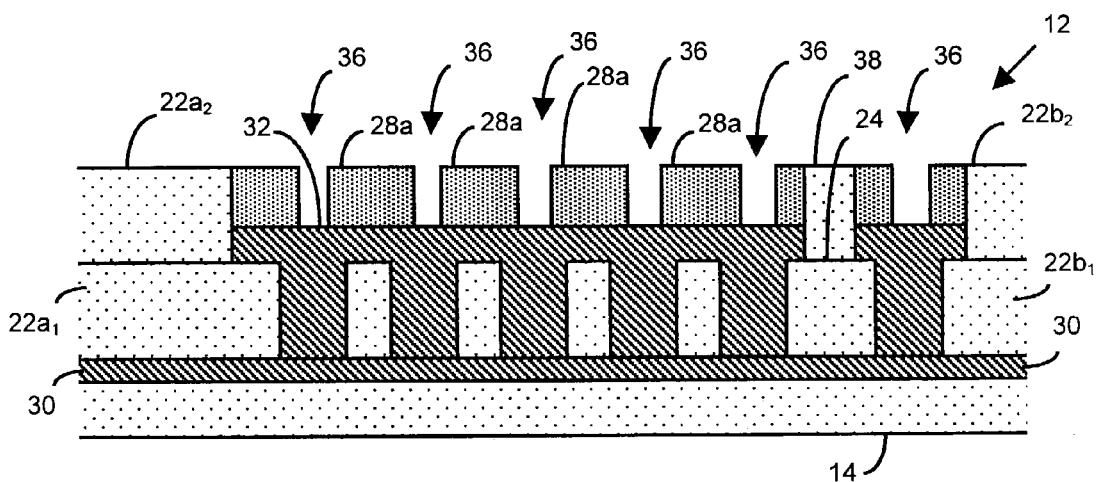

With reference to FIG. 6B, in one embodiment, after growing monocrystalline silicon field regions $22a_2$ and $22b_2$ (and contact area 24), first encapsulation layer 28a may be deposited, formed and/or grown. The first encapsulation layer 28a may be, for example, a silicon-based material (for example, silicon/germanium, silicon carbide, monocrystalline silicon, polycrystalline silicon or amorphous silicon, whether doped or undoped), germanium, and gallium arsenide (and combinations thereof, which is deposited and/or formed using, for example, an epitaxial, a sputtering or a CVD-based reactor (for example, APCVD, LPCVD, or PECVD). The deposition, formation and/or growth may be by a conformal process or non-conformal process. The material may be the same as or different from first monocrystalline silicon field regions $22a_2$ and $22b_2$. In the illustrated embodiment, first encapsulation layer 28a is comprised of a polycrystalline silicon material.

The subsequent processing of micromachined mechanical structure 12 is substantially similar to that described above with respect to FIGS. 4E–4G. As such, the discussion above with respect to micromachined mechanical structure 12, in conjunction with FIGS. 4E–4G, is entirely, fully and completely applicable to this set of embodiments. For the sake of brevity, that description will not be repeated but rather will be summarized.

Figure 6D:
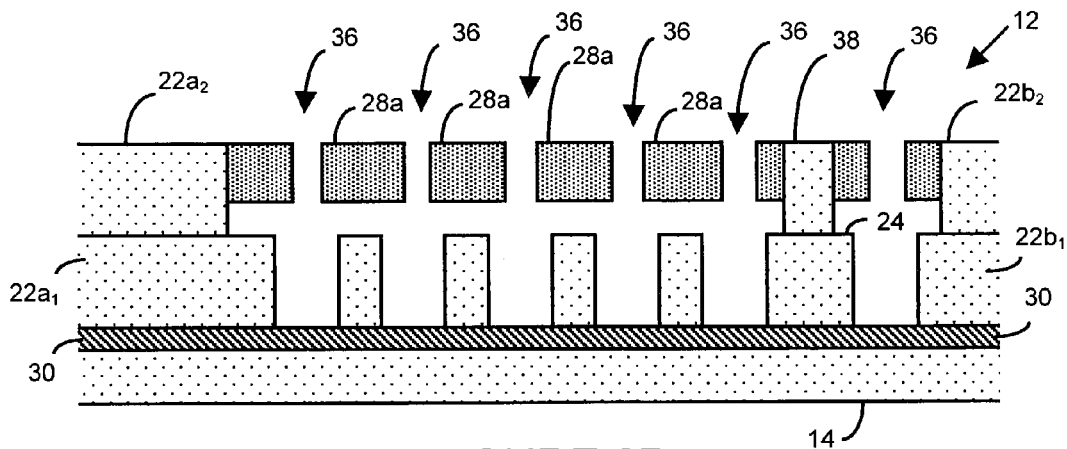

Briefly, first encapsulation layer 28a may be etched (see, FIG. 6C) to form passages or vents 36 that are intended to permit etching and/or removal of at least selected portions of first and second sacrificial layers 30 and 32, respectively (see, FIG. 6D). Again, proper design of mechanical structures 20a–d and sacrificial layers 30 and 32, and control of the etch process parameters may permit the sacrificial layer 30 to be sufficiently etched to remove all or substantially all of layer 30 around mechanical elements 20a–d and thereby release mechanical elements 20a–d to permit proper operation of MEMS 10 (see, FIG. 6D).

Figure 6E:
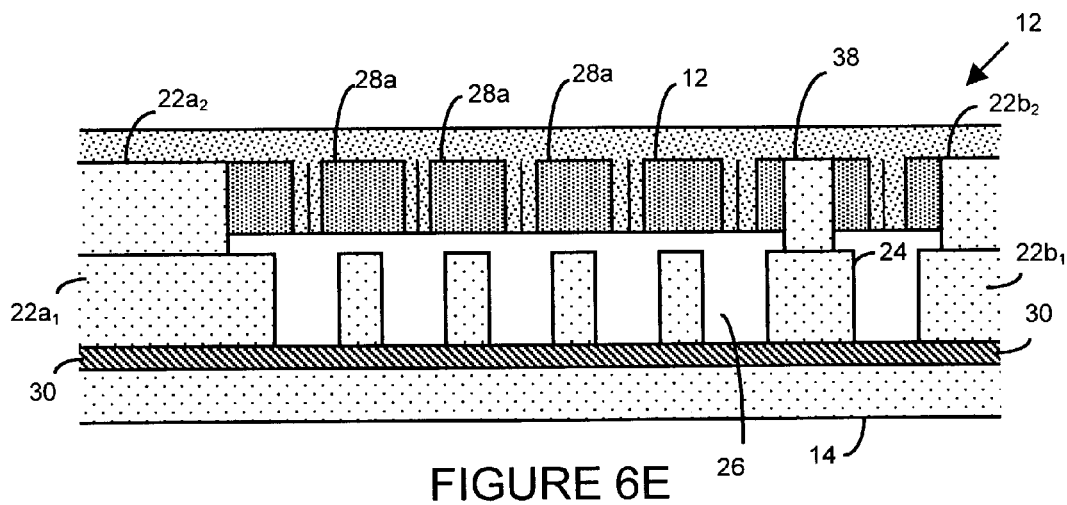
Figure 6F:
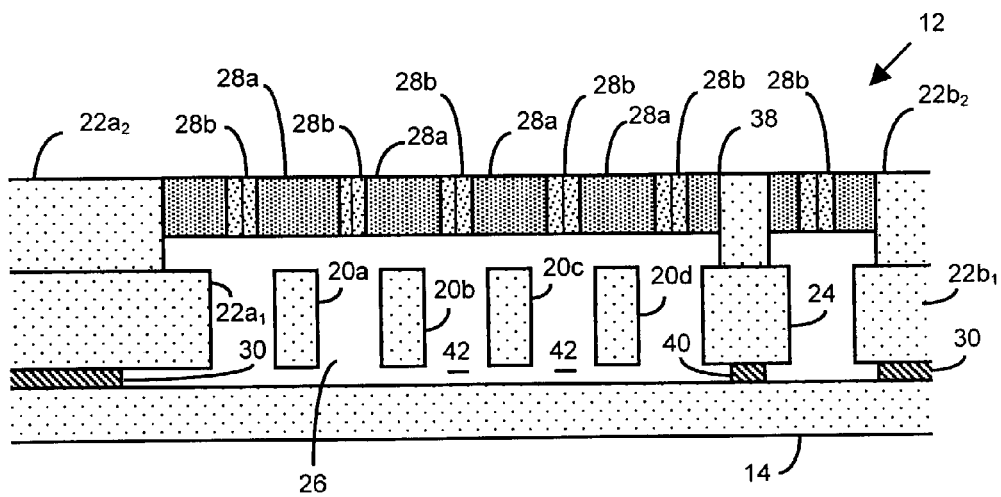

After releasing mechanical elements 20a–d, second encapsulation layer 28b may be deposited, formed and/or grown (see, FIG. 6E). The second encapsulation layer 28b may be, for example, a silicon-based material (for example, a monocrystalline silicon, polycrystalline silicon and/or silicon-germanium), which is deposited using, for example, an epitaxial, a sputtering or a CVD-based reactor (for example, APCVD, LPCVD, or PECVD). The deposition, formation and/or growth may be by a conformal process or non-conformal process. The material may be the same as or different from first encapsulation layer 28a. As mentioned above, however, it may be advantageous to employ the same material to form first and second encapsulation layers 28a and 28b in order to enhance the "seal" of chamber 26.

Figure 7A:
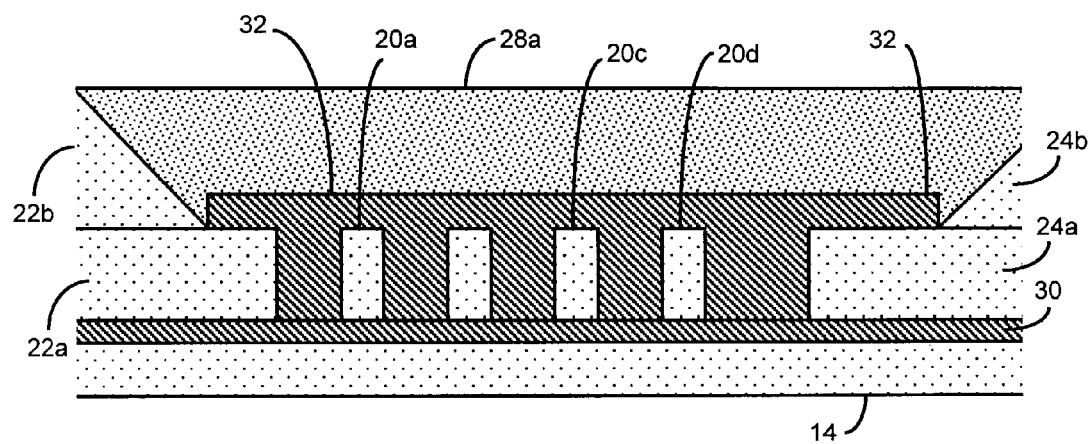
FIGS. 7A–7C illustrate, among other things, cross-sectional views of more representative illustrations of the growth of single crystal structures using non-conformal and conformal deposition, growth and/or formation techniques.
Figure 7B:
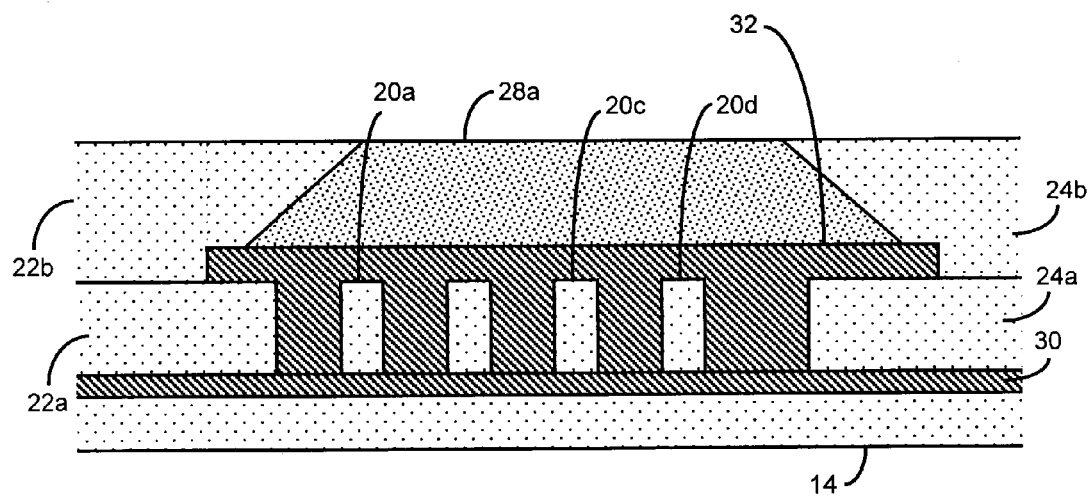
Figure 7C:
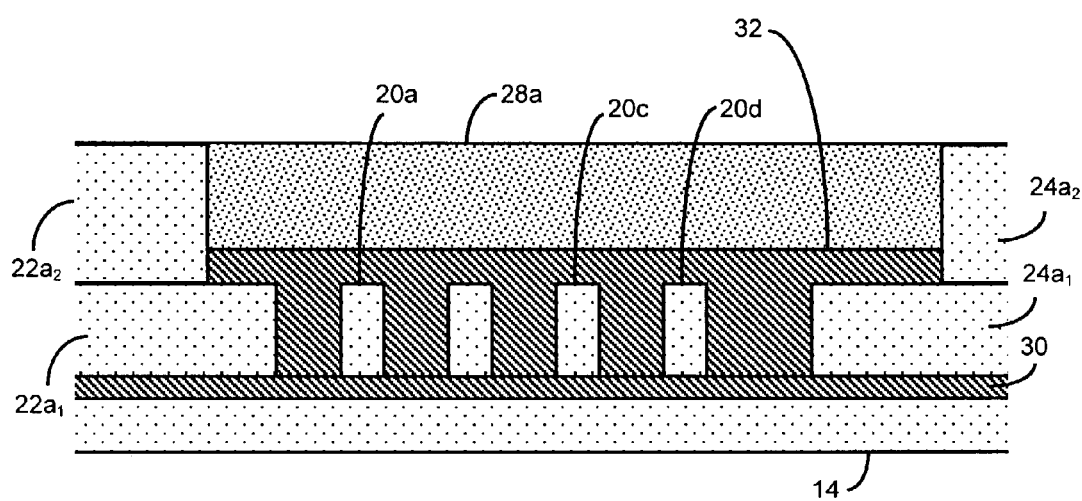

It should be noted that the materials and/or surfaces underlying second encapsulation layer 28b, as well as the techniques employed to deposit, form and/or grow first and second encapsulation layer 28b, may initially determine the crystalline structure of the underlying material. For example, in an epitaxial environment having a predetermined set of parameters, the single/mono crystalline structure of encapsulation layers 28a and/or 28b may deposit, form and/or grow in a "retreating" manner (see, FIG. 7A). In contrast, with another predetermined set of parameters, the single/mono crystalline structure of encapsulation layers 28a and/or 28b may deposit, form and/or grow in an "advancing" manner (see, FIG. 7B). The structures and elements herein may be deposited, formed and/or grown in these or other manners. Accordingly, the single/mono crystalline structure (for example, field region $22a_2$ and contact area $24a_2$ that is deposited, formed and/or grown on a material having single/mono crystalline structure (for example, field region $22a_1$, and contact area $24a_1$) is illustrated schematically as depositing, forming and/or growing in the perpendicular direction (see, for example, FIG. 7C) regardless of the manner or processes of employed.

It should be further noted that the material comprising second encapsulation layer 28b may deposit, form or grow over surfaces in chamber 26 (for example, the surfaces of mechanical structures 20a–d) as the chamber is sealed or encapsulated. When depositing, forming and/or growing second encapsulation layer 28b, care may need to be taken to preserve the desired integrity of the structures and/or surfaces within chamber 26 (see, for example, FIG. 13).

As mentioned above, in certain embodiments, second encapsulation layer 28b is doped with impurities having an opposite conductivity relative to the impurities in first encapsulation layer 28a. In this way, upon completion of the sealing or encapsulation process, junctions surrounding electrical contact area 24 are formed which electrically "isolate" contact area 24 from, for example, field region 22b.

Further, as mentioned above, in another set of embodiments, where second encapsulation layer 28b is deposited, formed and/or grown to a level that exceeds first encapsulation layer 28a, it may be advantageous to substantially planarized the exposed surface using, for example, polishing techniques (for example, CMP). The planarization process removes a portion of second encapsulation layer 28b to provide a "smooth" surface layer and/or (substantially) planar surface. Indeed, the planarization process may remove a sufficient portion of second encapsulation layer 28b so that contact via 38 is electrically isolated by a ring of oppositely doped semiconductor layer 28b (See, FIG. 6F). Again, as mentioned above, this exposed planar surface may further provide a well-prepared base upon which integrated circuits (for example, CMOS transistors) and/or micromachined mechanical structure 12 may be fabricated on or in using well known fabrication techniques and equipment.

As illustrated, monocrystalline silicon field region $22b_2$ grow on and above contact area 24. In another embodiment, field region $22b_2$ does not grow on or over contact area 24. In this embodiment, contact via 38 is comprised primarily of polycrystalline silicon rather than monocrystalline silicon. Moreover, as described above, contact via 38 may be doped with impurities to enhance the conductivity of the material comprising contact via 38.

With reference to FIGS. 8A–E, in another set of embodiments, first encapsulation layer 28a may be a permeable or semi-permeable material (for example, an amorphous sputtered silicon or porous CVD and/or epitaxial deposited polycrystalline silicon). In this set of embodiments, the process of etching or removing layers 30 and 32 may be performed through the permeable or semi-permeable material comprising layer 28a. Thereafter, when depositing, forming and/or growing second encapsulation layer 28b (for example, polycrystalline silicon) on first encapsulation layer 28a, the material may migrate to, fill and/or occupy the pores of first encapsulation layer 28a. Under this circumstance, relatively little material may deposit on the surfaces of the structures within chamber 26 during deposition, formation and/or growth of second encapsulation layer 28b. As such, chamber 26 may be "sealed" or encapsulated towards the upper surfaces of first encapsulation layer 28a (i.e., the surface that are first exposed to the deposition, formation and/or growth process—see, for example, FIG. 8D).

For example, in one embodiment, where the permeable or semi-permeable material is an amorphous sputtered silicon or porous CVD deposited polycrystalline silicon, having a thickness of between 0.1 μm and 2 μm. After etching and/or removal of layers 30 and 32, second encapsulation layer 28b may be a thickness of between 5 μm and 25 μm.

Figure 8A:
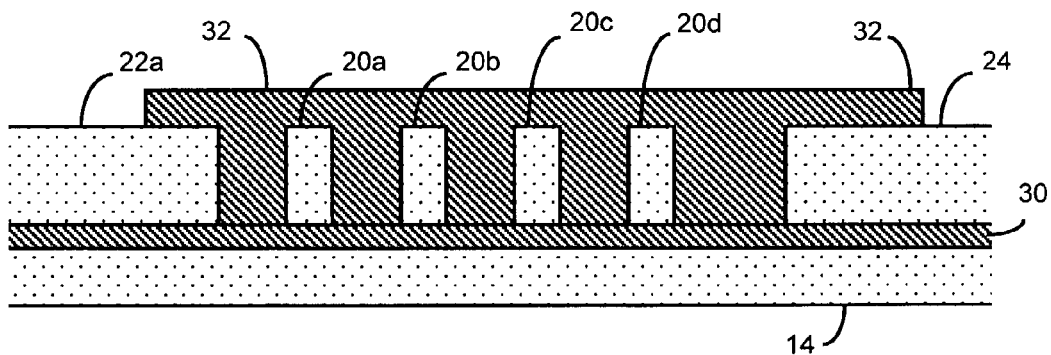
FIGS. 8A–8E illustrate cross-sectional views of the fabrication of the microstructure at various stages of an encapsulation process where the first encapsulation layer is a permeable material, according to certain aspects of the present invention.
Figure 8B:
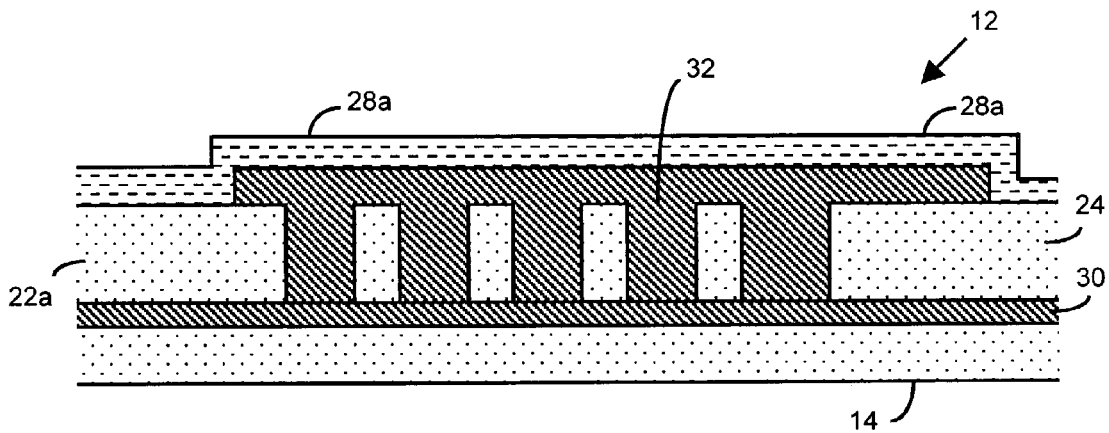
Figure 8C:
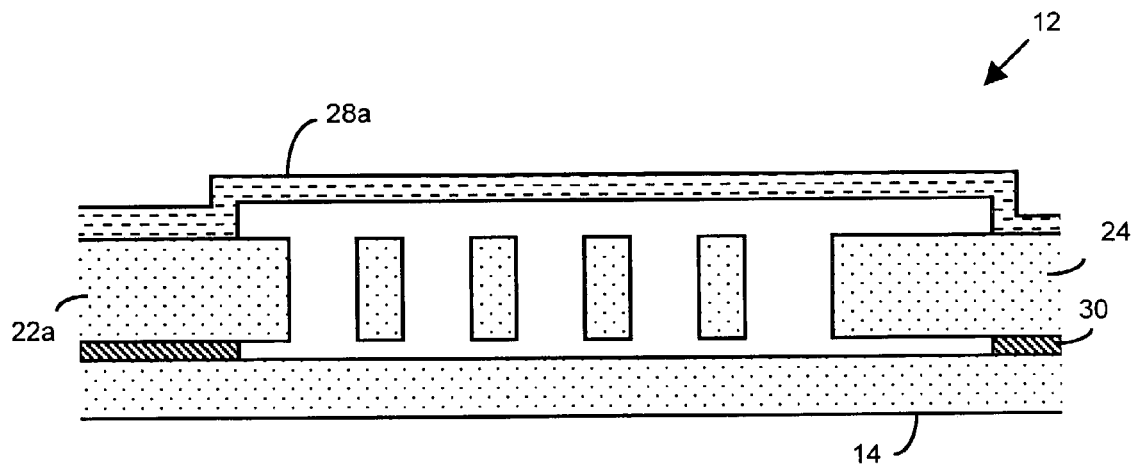
Figure 8D:
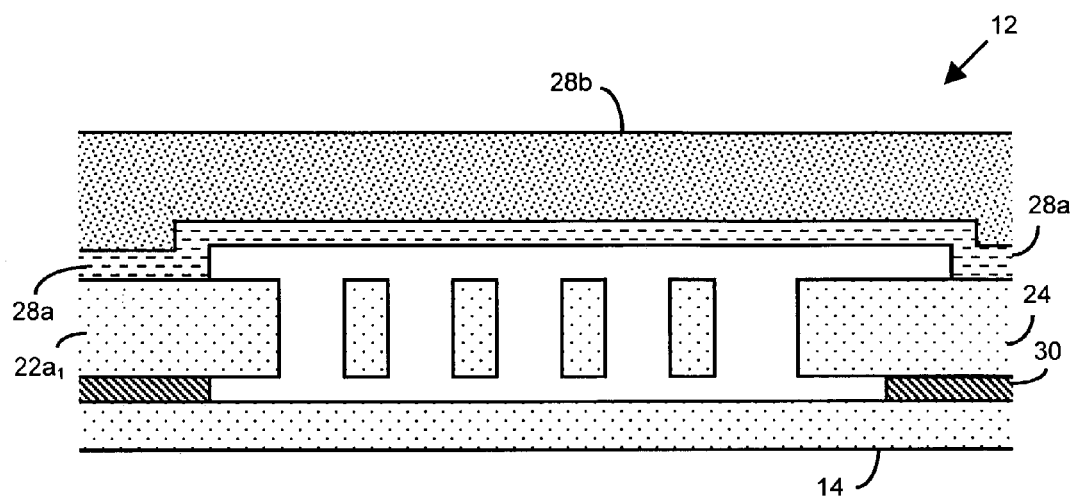

With reference to FIG. 8C, the material comprised of first encapsulation layer 28a may also be densified and thereby "closed" and chamber 26 "sealed" using an annealing process. That is, in this embodiment, heat treating micromachined mechanical structure 12, after etching first and second sacrificial layers 30 and 32, may cause the material of layer 28a to densify thereby sealing or encapsulating chamber 26. As such, a second encapsulation layer 28b may not be necessary to initially seal chamber 26.

Figure 8E:
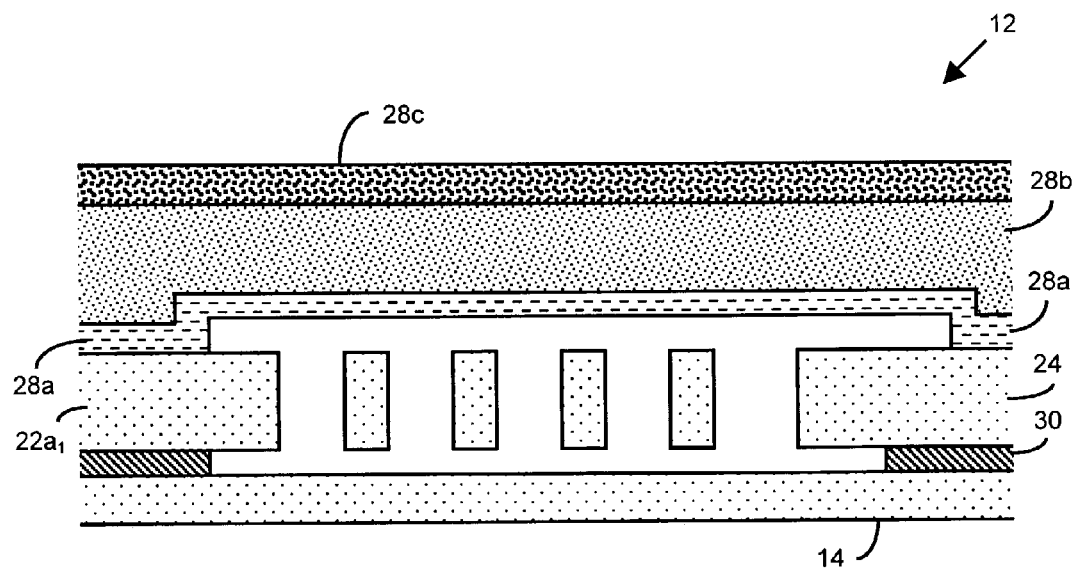

With reference to FIG. 8E, in one embodiment, the encapsulation process of chamber 26 may include three or more encapsulation layers. The second encapsulation layer 28b and third encapsulation layer 28C (or subsequent/additional layers) may be deposited, formed and/or grown to "seal" chamber 26. In particular, second encapsulation layer 28b may be, for example, a semiconductor material (for example, silicon, silicon carbide, silicon-germanium or germanium) or metal bearing material (for example, silicides or TiW), which is deposited using, for example, an epitaxial, a sputtering or a CVD-based reactor (for example, APCVD, LPCVD or PECVD). The deposition, formation and/or growth may be by a conformal process or non-conformal process. The material comprising encapsulation layer 28b may be the same as or different from first encapsulation layer 28a.

Thereafter, third encapsulation layer 28c may be deposited, formed and/or grown (see, FIG. 8E). The third encapsulation layer 28c may "seal" or close, or more fully "seal" or close chamber 26. The deposition, formation and/or growth of third encapsulation layer 28c may be the same as, substantially similar to, or different from that of encapsulation layers 28a and/or 28b. In this regard, third encapsulation layer 28c may be comprised of, for example, a semiconductor material, an insulator material (for example, silicon nitride or silicon oxide), plastic (for example, photo resist or low-K dielectric) or metal bearing material. The third encapsulation layer 28c may be deposited and/or formed using, for example, an epitaxial, a sputtering or a CVD-based reactor (for example, APCVD, LPCVD or PECVD). The deposition, formation and/or growth process may be conformal or non-conformal.

It should be noted that the techniques described above to facilitate integration of high performance integrated circuits in MEMS 10, may be implemented with the embodiment illustrated in FIGS. 8A–8E. In this regard, it may be advantageous to include field region 22a that is comprised of monocrystalline silicon in or on which such circuits may be fabricated. In one embodiment, a portion of first encapsulation layer overlying field region 22a may be recrystallized thereby "converting" or re-arranging the crystal structure of the amorphous sputtered silicon or porous CVD and/or epitaxial deposited polycrystalline silicon to that of a monocrystalline or substantially monocrystalline material. In this way, transistors or other components of, for example, data processing electronics 16, that are integrated in MEMS 10 may be fabricated in monocrystalline field regions 22a and/or 22b.

In another embodiment, the portion of first encapsulation layer 28a (and/or second encapsulation layer 28b) overlying field region 22a may be removed, using conventional etching techniques, to expose field region 22a. Thereafter, monocrystalline silicon may be grown on field region 22a. Alternatively, the portion of first encapsulation layer 28a (and second encapsulation layer 28b) overlying field region 22a may be etched to expose the single crystal material and, thereafter transistors or other active components may be integrated in or on field region 22a using well-known fabrication techniques.

Figure 9A:
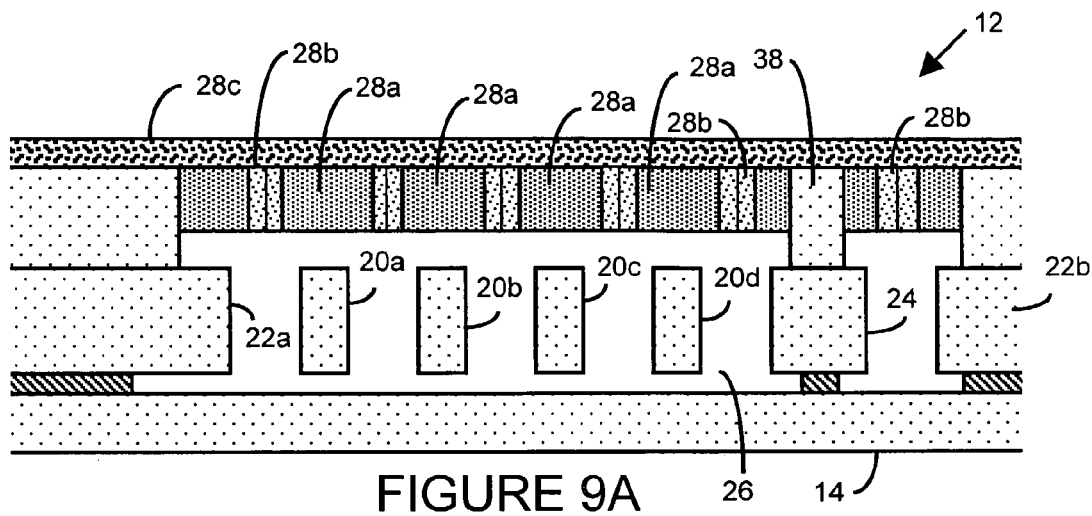
FIGS. 9A–9C illustrate a portion of the fabrication of the interdigitated or comb-like finger electrode array microstructure of FIG. 2, sectioned along dotted line a—a, in accordance with another aspect of the present invention including implementation of three or more encapsulation layers (FIG. 9A) and contact interconnect (FIG. 9C)
Figure 9B:
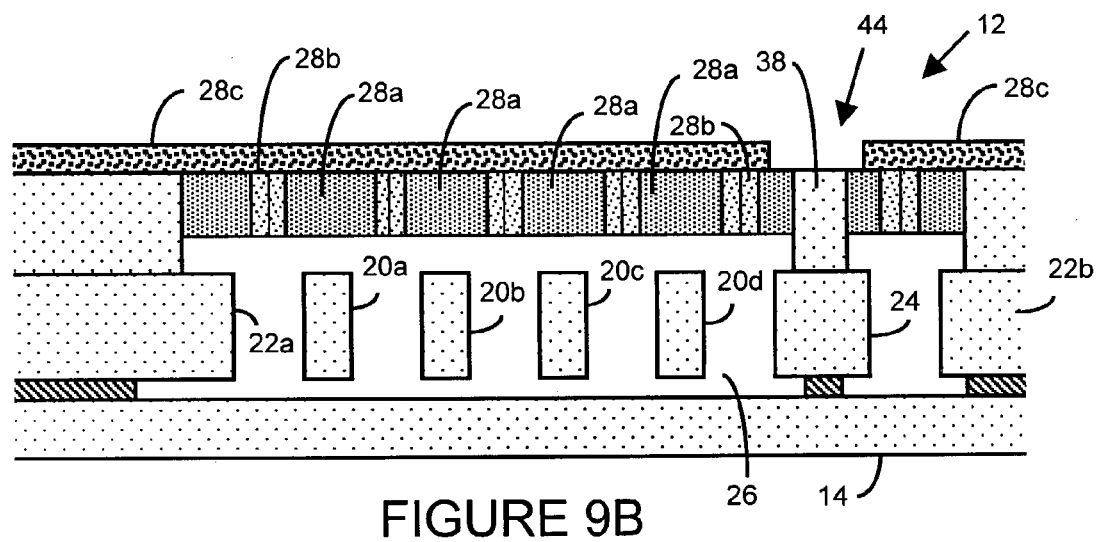
Figure 9C:
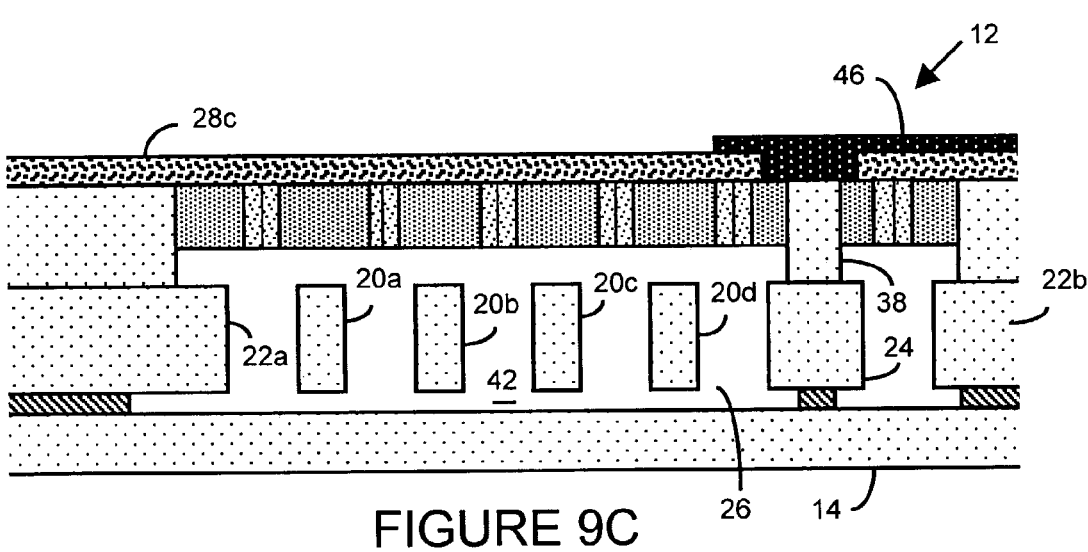

It should be further noted that encapsulation layer 28c (see, for example, FIG. 8E and FIG. 9A) may be deposited, formed and/or grown to, for example, provide a more planar surface, an etch stop layer for subsequent processing, an insulation layer, a ground plane, a power plane, and/or enhance the "seal" of chamber 26 and thereby enhance the barrier to diffusion of fluid 42. For example, with reference to FIGS. 9A–C, layer 28c may be an insulation layer which, in addition (or in lieu thereof) facilitates suitable interconnection with contact area 24 and contact via or plug 38 (for example, using a highly doped polysilicon or metal layer). Thereafter (or currently therewith), layer 28c is patterned to provide contact opening 44 (FIG. 9B). A highly conductive (low electrical resistance) material (for example, a heavily doped semiconductor and/or a metal such as aluminum, chromium, gold, silver, molybdenum, platinum, palladium, tungsten, titanium, and/or copper) may then be deposited to facilitate interconnection (FIG. 9C).

It should be noted that deposition, formation and/or growth of insulation layer 28c and layer 46 may be two of the final process step in the "back-end" of the integrated circuit fabrication of MEMS 10. In this regard, such processing is "combined" with the insulating and contact formation step of the "back-end" of the integrated circuit fabrication of MEMS 10. In this way, fabrication costs may be reduced.

Depending upon the purpose or function of encapsulation layer 28c, it may be, for example, a semiconductor material (for example, a polycrystalline silicon, silicon carbide, silicon/germanium or germanium), an insulator material (for example, silicon dioxide, silicon nitride, BPSG, PSG, or SOG) or metal bearing material (for example, silicides). The encapsulation layer 28c may be, for example, deposited, formed or grown using, for example, an epitaxial, a sputtering or a CVD-based reactor (for example, APCVD, LPCVD or PECVD). The deposition, formation and/or growth may be by a conformal process or non-conformal process. The material comprising encapsulation layer 28c may be the same as or different from the other encapsulation layers.

In another set of embodiments, second encapsulation layer 28b may be comprised of metal (for example, aluminum, chromium, gold, silver, molybdenum, platinum, palladium, tungsten, titanium, and/or copper), metal oxide (for example, aluminum oxide, tantalum oxide, and/or indium oxide), metal alloy (for example, titanium-nitride, titanium-tungsten and/or Al—Si—Cu) and/or metal-silicon compound (for example, silicides such as tungsten silicide, titanium silicide, and/or nickel silicide) (hereinafter, collectively called "metal bearing material(s)") deposited and/or formed using, for example, an epitaxial, a sputtering or a CVD-based reactor (for example, APCVD, LPCVD, or PECVD). In this set of embodiments, first encapsulation layer 28a may be comprised of metal bearing material, semiconductor material or insulator material deposited and/or formed using, for example, an epitaxial, a sputtering or a CVD-based reactor (for example, APCVD, LPCVD, or PECVD).

Figure 10A:
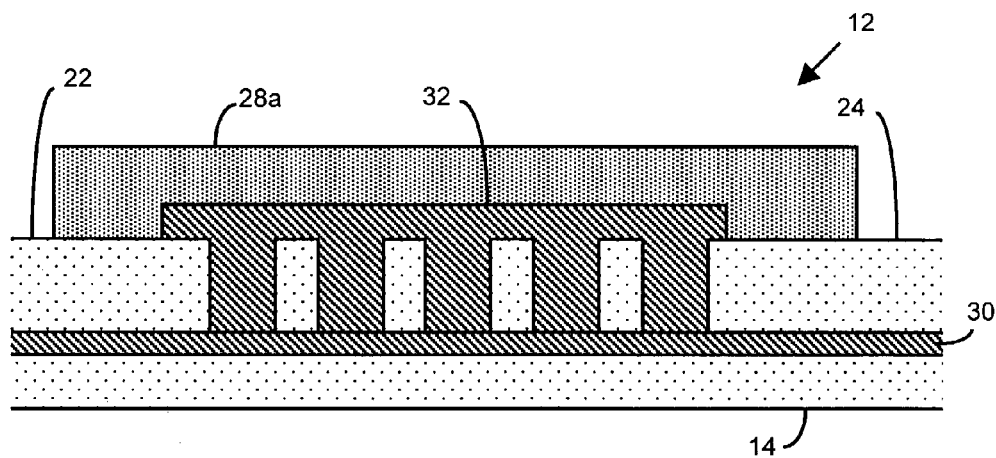
FIGS. 10A–10F illustrate cross-sectional views of the fabrication of the microstructure, according to certain aspects of the present invention, at various stages of the process.

For example, with reference to FIG. 10A, after formation of the integrated circuit portion of MEMS 10 (if any), first encapsulation layer 28a is deposited, grown and/or formed on second sacrificial layer 32 (see, FIG. 10A) while selected portions of field region 22 and contact area 24 are protected via a mask or re-exposed by etching. The first encapsulation layer 28a may be, for example, an insulator material (for example, a silicon nitride, silicon dioxide, PSG or BPSG), which is deposited using, for example, an epitaxial, a sputtering or a CVD-based reactor (for example, APCVD, LPCVD, or PECVD). The deposition, formation and/or growth may be by a conformal process or non-conformal process. Indeed, deposition, formation and/or growth of first encapsulation layer 28a may be a process step in the "back-end" of the integrated circuit fabrication of MEMS 10.

Figure 10B:
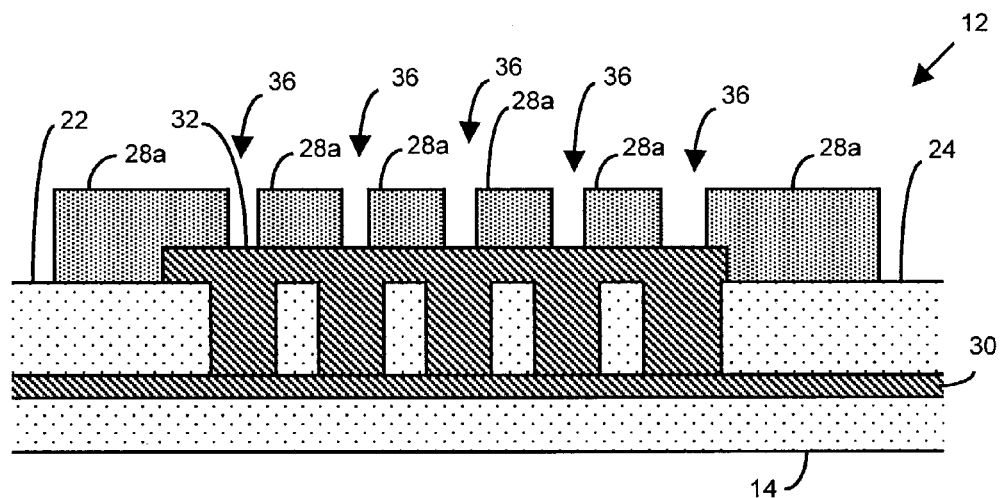
Figure 10C:
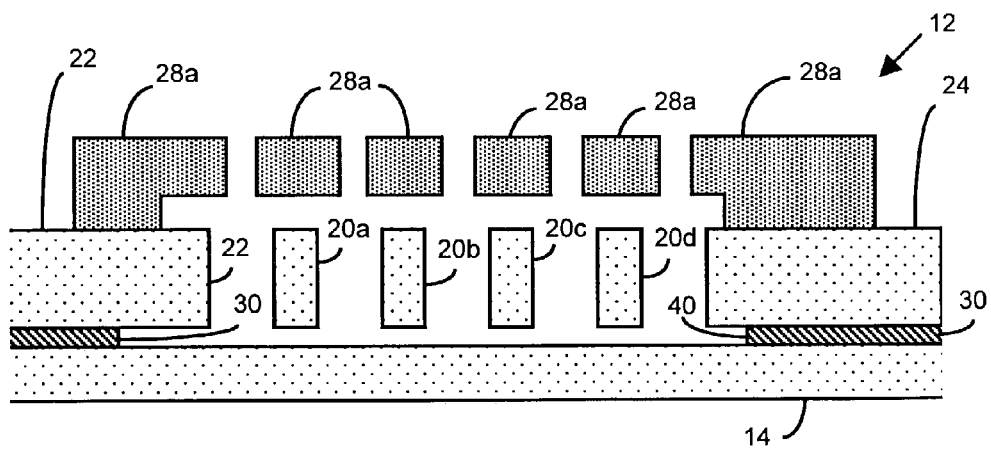

Thereafter, first encapsulation layer 28a may be etched to form passages or vents 36 (see, FIG. 10B). At least selected portions of first and second sacrificial layers 30 and 32, respectively, (see, FIG. 10C) which releases mechanical elements 20a–d to permit proper operation of MEMS 10.

Figure 10D:
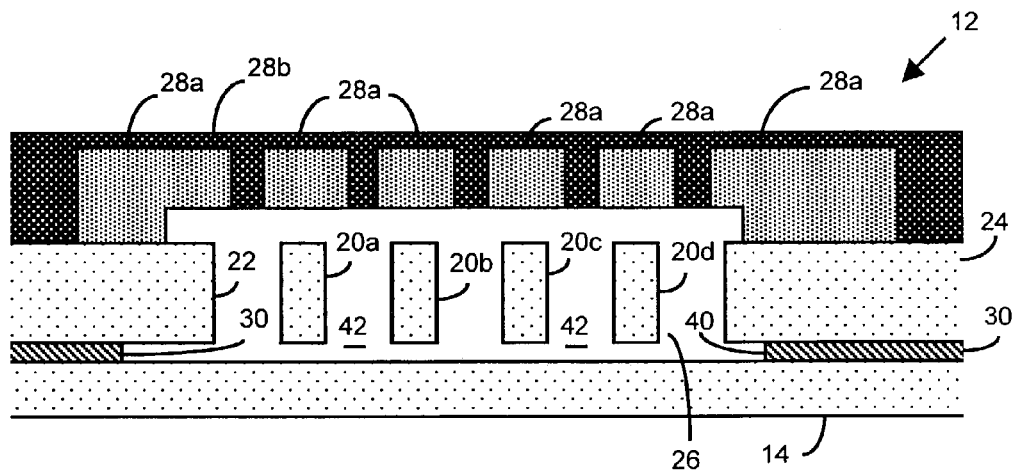

After releasing mechanical elements 20a–d, second encapsulation layer 28b may be deposited, formed and/or grown (see, FIG. 10D). In this embodiment, second encapsulation layer 28b is metal bearing material that is deposited using, for example, an epitaxial, a sputtering or a CVD-based reactor (for example, APCVD, LPCVD, or PECVD). The deposition and/or formation may be by a conformal process or non-conformal process. The deposition, formation and/or growth of second encapsulation layer 28b may also be "combined" with the contact formation step of the "back-end" of the integrated circuit fabrication of MEMS 10. In this way, fabrication costs may be reduced.

Figure 10E:
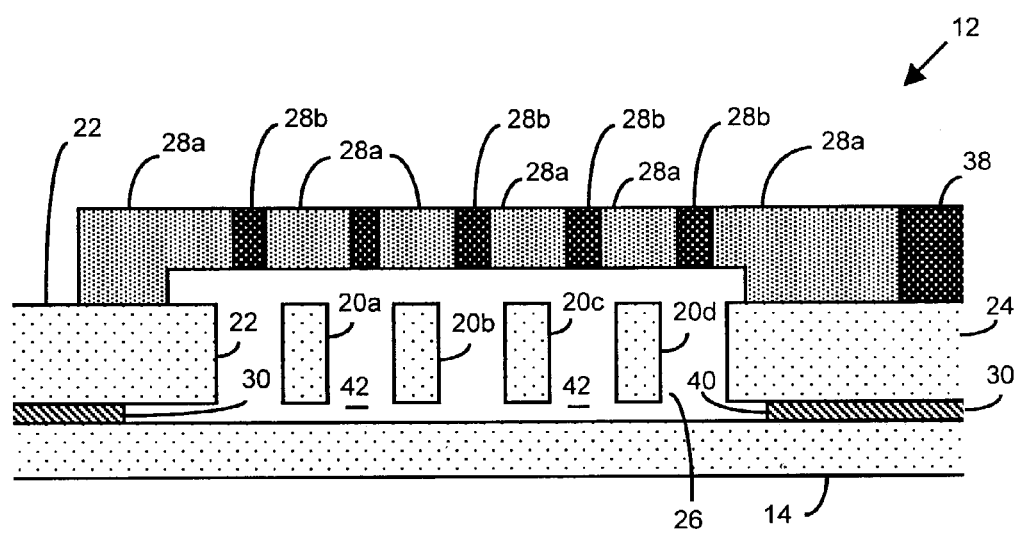
Figure 10F:
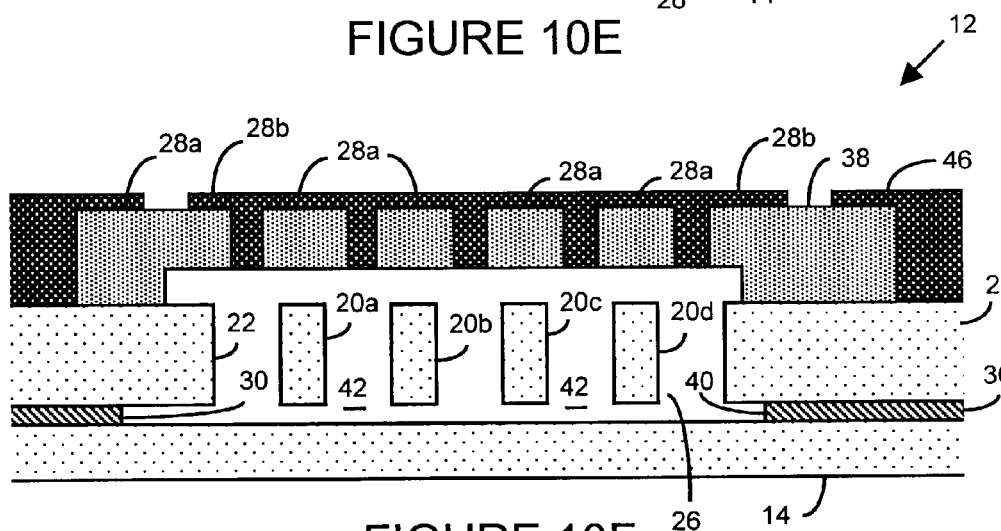

Thereafter, it may be advantageous to electrically "isolate" contact area 24 from, for example, field region 22. In one embodiment, this is accomplished using a planarization technique. In this regard, the exposed surface of second encapsulation layer 28b is substantially planarized using, for example, polishing techniques (for example, CMP). The planarization process removes a sufficient portion of second encapsulation layer 28b to electrically isolated contact area 24 (see, FIG. 10E). In another embodiment, selected portions of second encapsulation layer 28b may be etched (see, FIG. 10F).

It should be noted that the portion of second encapsulation layer 28a overlying field region 22 may be removed, using conventional etching techniques, to expose field region 22 (see, FIG. 9E). In this way, monocrystalline silicon may be grown and/or formed on field region 22. Thereafter, transistors or other active components may be integrated in or on MEMS 10 using well-known fabrication techniques.

Indeed, in those situations where first encapsulation layer 28a is deposited, formed and/or grown over field region 22 and/or contact area 24 without the use of a mask, selected portions of first encapsulation layer 28a that overlying field are 22 and/or contact area 24 may be etched to expose portions and the monocrystalline silicon. Thereafter, monocrystalline silicon may be grown permitting integration of transistors or other active components as described above.

It should be further noted that the environment (for example, the gas or gas vapor pressure) within chamber 26 determines to some extent the mechanical damping for mechanical structures 20a–d. In this regard, chamber 26 includes fluid 42 that is "trapped", "sealed" and/or contained within chamber 26. The state of fluid 42 within chamber 26 (for example, the pressure) may be determined using conventional techniques and/or using those techniques described and illustrated in non-provisional patent application entitled "Electromechanical System having a Controlled Atmosphere, and Method of Fabricating Same", which was filed on Mar. 20, 2003 and assigned Ser. No. 10/392,528 (hereinafter "the Electromechanical System having a Controlled Atmosphere Patent Application").

The inventions described and illustrated in the Electromechanical System having a Controlled Atmosphere Patent Application may be implemented with any and all of the inventions described and illustrated in this application. For example, the encapsulation techniques described above may be implemented with techniques described in the Electromechanical System having a Controlled Atmosphere Patent Application to trap and/or seal a fluid having a selected, desired and/or predetermined state within the chamber. In this way, the fluid provides a desired, predetermined, appropriate and/or selected mechanical damping for mechanical structures within the chamber.

Figure 11A:
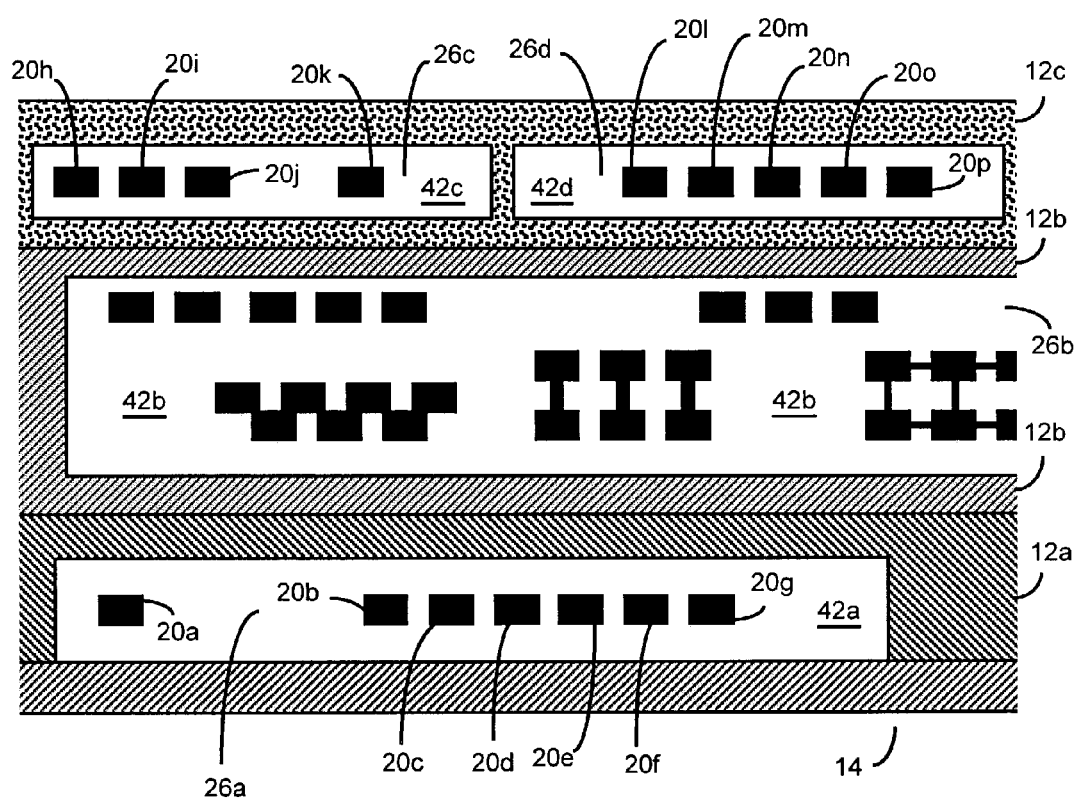
FIG. 11A illustrates a cross-sectional view of a portion of a plurality of micromechanical structures, each having one or more electromechanical systems, which are monolithically integrated on or within the substrate of a MEMS, in accordance with certain aspect of the present invention.

As another example, the Electromechanical System having a Controlled Atmosphere Patent Application describes a MEMS that includes a plurality of monolithically integrated micromachined mechanical structures having one or more electromechanical systems (for example, gyroscopes, resonators, temperature sensors and/or accelerometers). With reference to FIG. 11A, in one embodiment, MEMS 10 includes a plurality of micromachined mechanical structures 12a–c that are monolithically integrated on or disposed within substrate 14. Each micromachined mechanical structure 12a–c includes one or more mechanical structures 20a–p (for the sake of clarity only a portion of which are numbered) that are disposed in chambers 26a–d.

In certain embodiments, chambers 26a–d are sealed or encapsulated using the techniques described above. The chambers 26a–d may be sealed or encapsulated in the same or substantially the same manner or using differing techniques. In this way, the plurality of structures 12a–d may be fabricated in ways that provide the same, substantially the same, different or substantially different desired, predetermined, appropriate and/or selected mechanical damping for mechanical structures 20a–p.

Indeed, in at least one embodiment, structure 12c includes a plurality of chambers, namely chambers 26c and 26d, each containing fluid 42c and 42d, respectively. The chambers 22c and 22d may be sealed or encapsulated in a manner that fluids 42c and 42d, respectively, are maintained at the same or substantially the same selected, desired and/or predetermined states. As such, in this embodiment, fluids 42c and 42d may provide the same or substantially the same desired, predetermined, appropriate and/or selected mechanical damping for mechanical structures 20h–k and 20l–p, respectively.

Alternatively, in at least another embodiment, chambers 26c and 26d may be sealed or encapsulated using different or differing techniques such that fluids 24c and 24d may be "trapped", "sealed", maintained and/or contained in chambers 26c and 26d, respectively, at different or substantially different selected, desired and/or predetermined states. In this embodiment, chambers 26c and 26d may be "sealed" using different processing techniques, different processing conditions and/or different materials (for example, gases or gas vapors). As such, after encapsulation, fluids 42c and 42d provide different or substantially different mechanical damping characteristics for mechanical structures 20h–k and 20l–p, respectively. In this way, micromachined mechanical structure 12c may include different electromechanical systems (for example, gyroscopes, resonators, temperature sensors and accelerometers) that require different or substantially different mechanical damping characteristics for optimum, predetermined, desired operation.

For the sake of brevity, all of the inventions described and illustrated in the Electromechanical System having a Controlled Atmosphere Patent Application will not be repeated here. It is expressly noted, however, that the entire contents of the Electromechanical System having a Controlled Atmosphere Patent Application, including for example, the features, attributes, alternatives, materials, techniques and advantages of all of the inventions, are incorporated by reference herein.

Figure 12A:
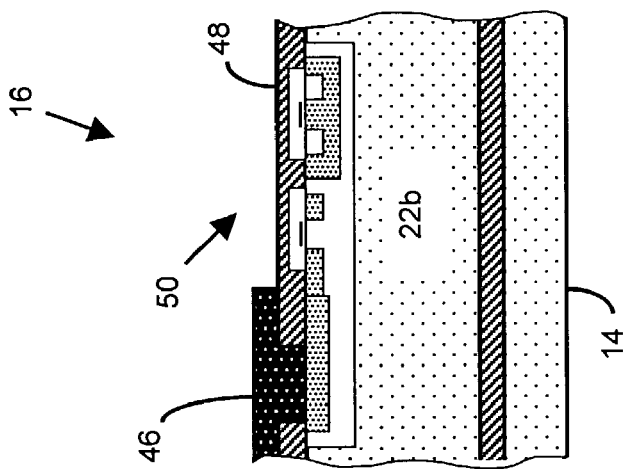
FIGS. 12A–12C illustrate cross-sectional views of MEMS, according to certain aspects of the present inventions, including a micromachined mechanical structure portion and an integrated circuit portion, both portions of which are disposed or integrated on a common substrate.
Figure 12A:
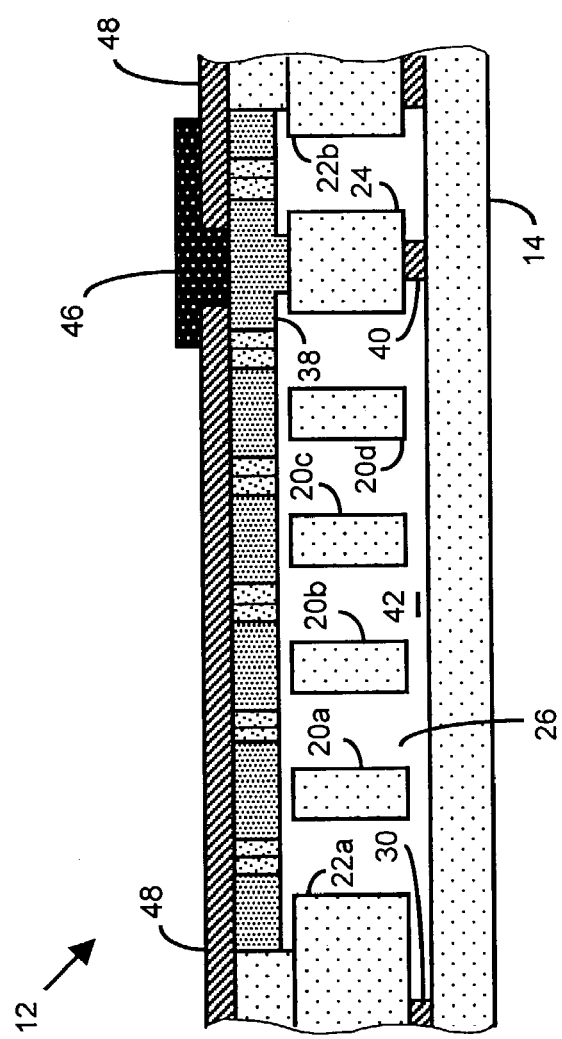
Figure 12B:
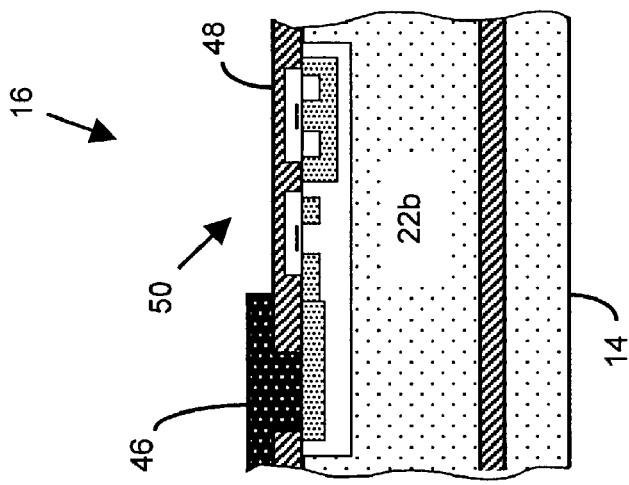
Figure 12B:
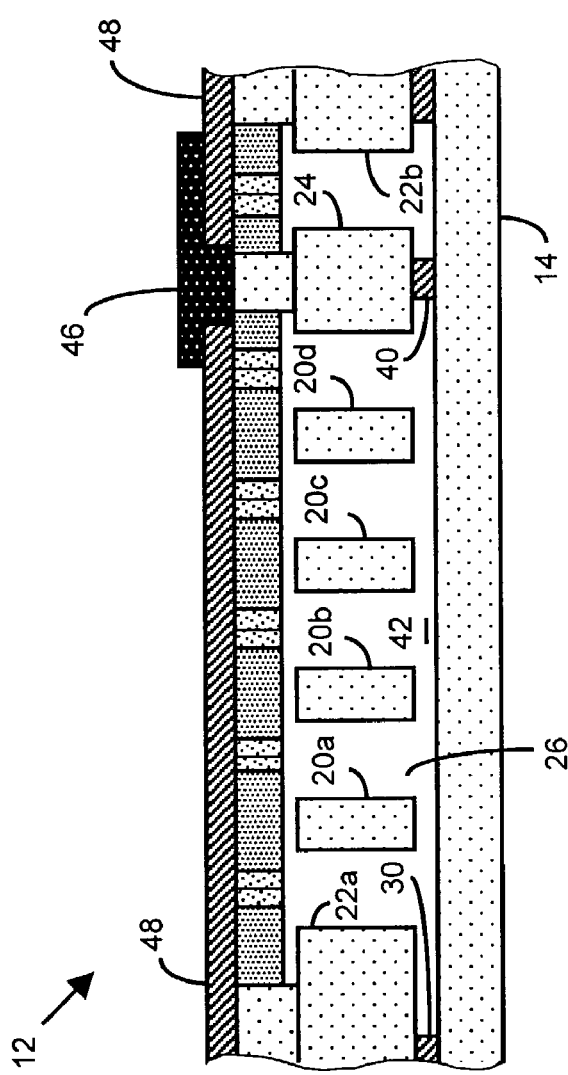
Figure 12C:
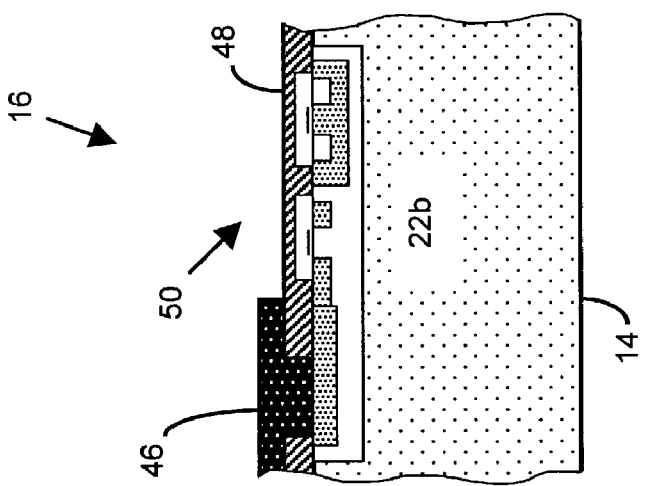
Figure 12C:
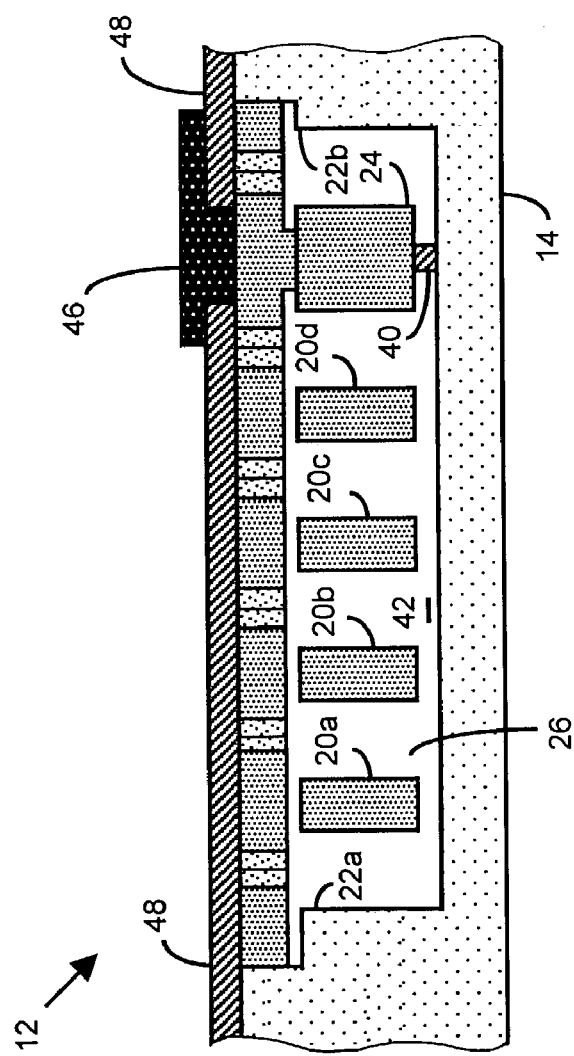

As mentioned above, in one set of embodiments, a monolithic structure may include mechanical structure 12 and data processing electronics 16 and/or interface circuitry 18 that are integrated on or in a common substrate. With reference to FIGS. 12A–12C, MEMS 10 includes micromachined mechanical structure 12, having structures 20a–20d and contact area 24, as well as data processing electronics 16, including integrated circuits 50 disposed in field region 22b (and/or region 22a—not illustrated). As mentioned above, mechanical structures 20a–20d (and contact 24) may be formed from, for example, a single crystalline material (FIGS. 12A and 12B) or a polycrystalline material (FIG. 12C). Moreover, contact via or plug 38 may also be formed from, for example, primarily a single crystalline material (FIG. 12B) or a polycrystalline material (FIGS. 12A and 12C).

It should be noted that mechanical structure 12 may be electrically connected to integrated circuits 50 via low resistance layer 46. The integrated circuits 50 may be fabricated using conventional techniques.

In particular, in those instances where contact 24 is accessed directly by integrated circuitry 50, it may be advantageous to provide a low resistance electrical path. The insulation layer 48 may be deposited, formed and/or grown and patterned to provide or facilitate interconnection with contact area 24. Thereafter, a low resistance layer 46 (for example, a heavily doped polysilicon or metal such as aluminum, chromium, gold, silver, molybdenum, platinum, palladium, tungsten, titanium, and/or copper) is formed.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

Figure 11B:
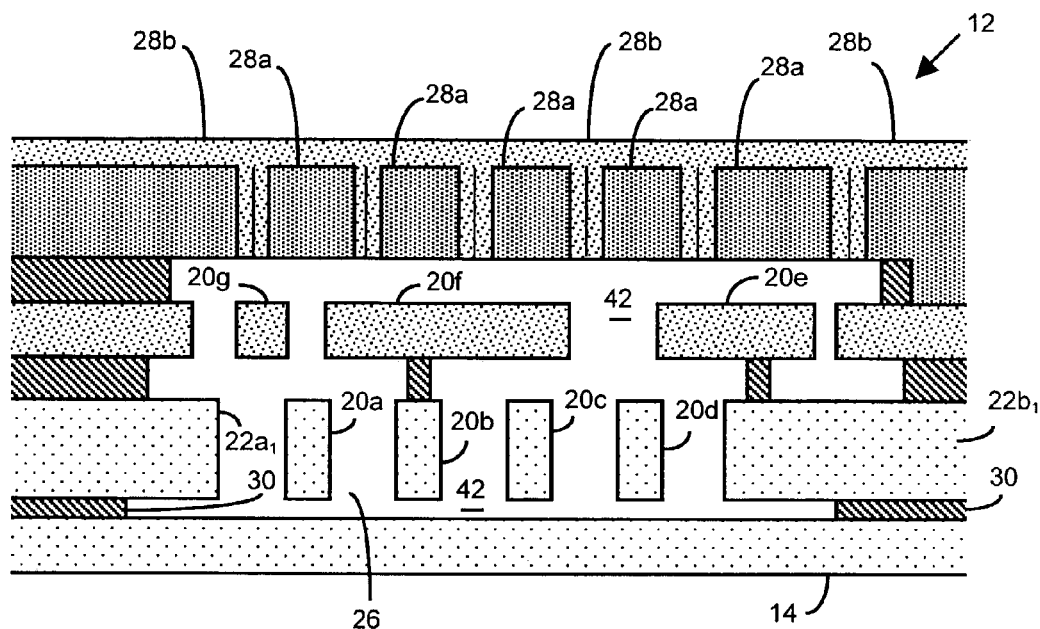
FIG. 11B–11D illustrate cross-sectional views of a portion of a micromechanical structure, having a plurality of micro-structures, which are monolithically integrated on or within the substrate of a MEMS, in accordance with certain aspect of the present invention
Figure 11C:
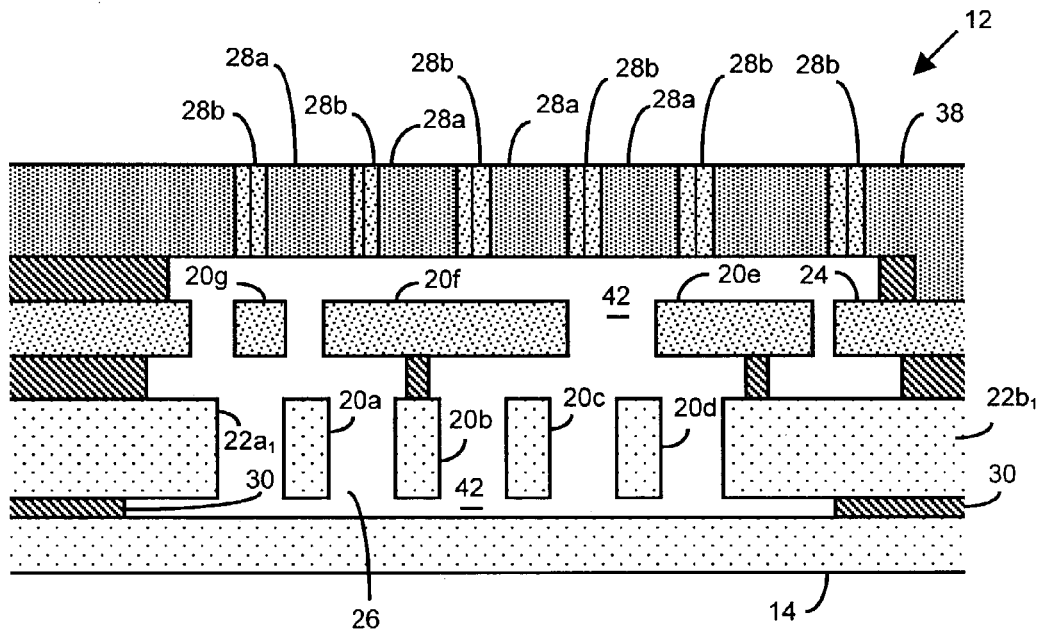
Figure 11D:
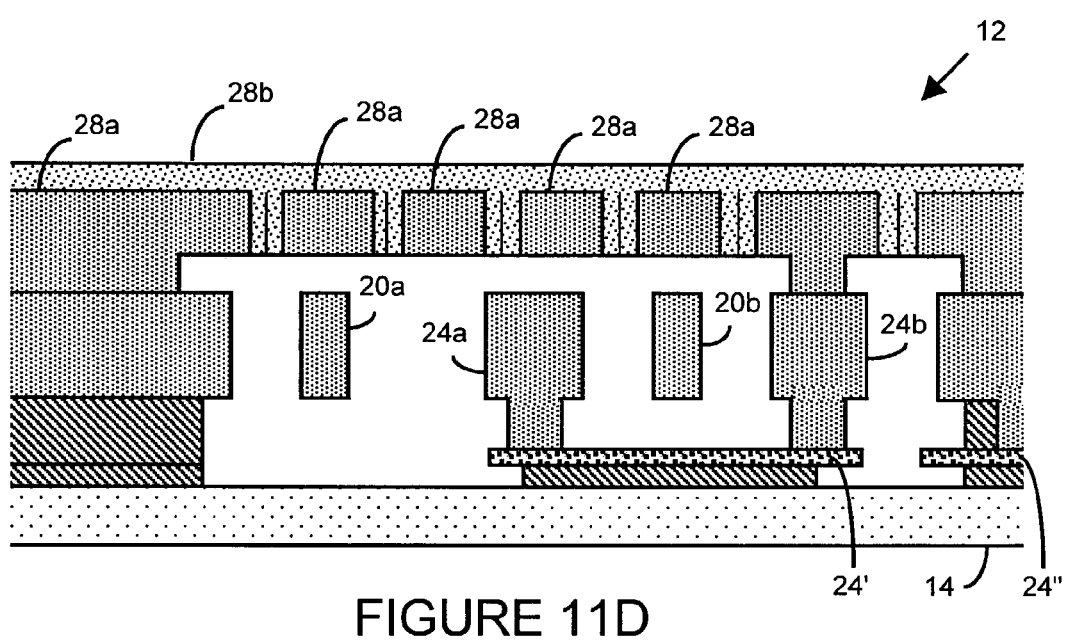

For example, any and all of the embodiments illustrated and described herein may include multiple layers of mechanical structures, contacts areas and buried contacts that are vertically and/or laterally stacked or interconnected (see, for example, micromachined mechanical structure 12 of FIGS. 11B, 11C and 11D). Moreover, single layer and multiple layers of mechanical structures may be themselves be vertically and/or laterally stacked or interconnected (see, for example, micromachined mechanical structure 12b of FIG. 11A). Further, the resulting micromachined mechanical structure 12 may be integrated with integrated circuitry 50 on a common substrate 14. Any vertical and/or lateral location of micromachined mechanical structure 12, relative to integrated circuitry 50, may be suitable.

Figure 13:
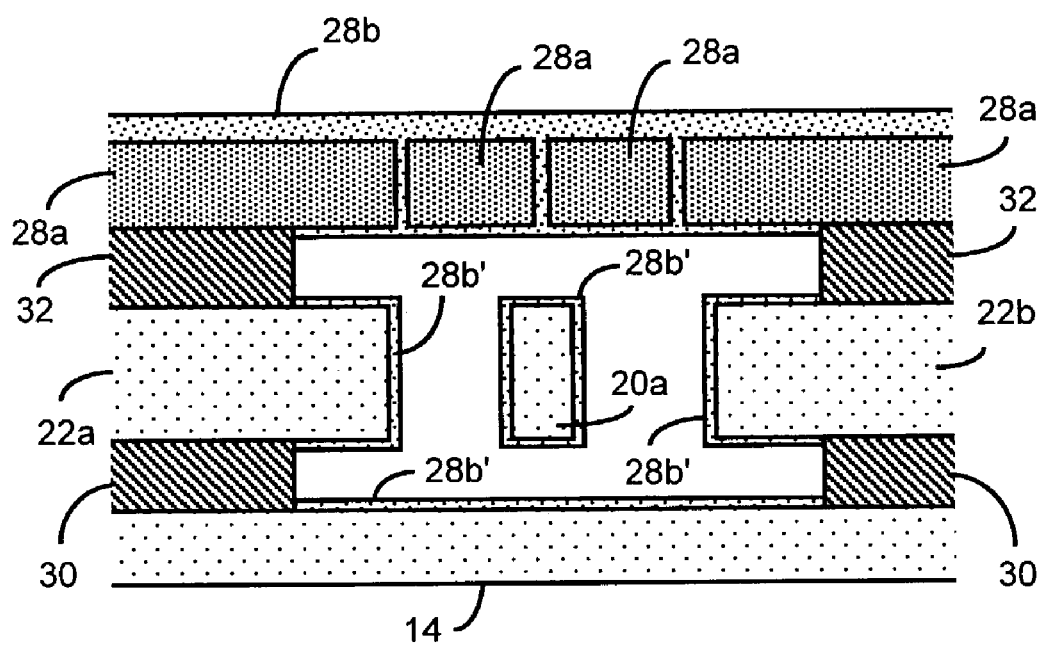
FIG. 13 illustrates a cross-sectional view of a portion of a micromachined micromechanical structure, having a microstructure, which includes a layer of the second encapsulation layer deposited thereon.

Moreover, with reference to FIG. 13, in those instances where the material comprising a second or subsequent encapsulation layer (for example, second encapsulation layer 28b) deposits, forms or grows over selected surfaces of the structures in chamber 26 (for example, the surfaces of mechanical structures 20a–d and field areas 22a and 22b) as chamber 26 is sealed or encapsulated, it may be advantageous to design and fabricate mechanical structures 20a–d to account for the deposition, formation or growth of the additional material. The thickness of the additional material 28b' on the surfaces of mechanical structures 20a–d may be approximately equal to the width or diameter of vent 36. Accordingly, in one set of embodiments, the design (for example, thickness, height, width and/or lateral and/or vertical relation to other structures in chamber 36) of mechanical structures 20a–d incorporates therein such additional material 28b' and the fabrication of mechanical structures 20a–d to provide a final structure includes at least two steps. A first step which fabricates mechanical structures 20a–d according to initial dimensions (for example, as described above with respect to FIGS. 4A and 4B) and a second step that includes the deposition, formation or growth of material 28b' as a result of deposition, formation or growth of at least one encapsulation layer, for example, second encapsulation layer 28b and/or subsequent encapsulation layer.

The term "depositing" and other forms (i.e., deposit, deposition and deposited) in the claims, means, among other things, depositing, creating, forming and/or growing a layer of material using, for example, a reactor (for example, an epitaxial, a sputtering or a CVD-based reactor (for example, APCVD, LPCVD, or PECVD)).

Further, in the claims, the term "contact" means a conductive region, partially or wholly disposed outside the chamber, for example, the contact area and/or contact via.

Finally, it should be further noted that while the present inventions have been described in the context of microelectromechanical systems including micromechanical structures or elements, the present inventions are not limited in this regard. Rather, the inventions described herein are applicable to other electromechanical systems including, for example, nanoelectromechanical systems. Thus, the present inventions are pertinent to electromechanical systems, for example, gyroscopes, resonators, temperatures sensors and/or accelerometers, made in accordance with fabrication techniques, such as lithographic and other precision fabrication techniques, which reduce mechanical components to a scale that is generally comparable to microelectronics.

What is claimed is:

1. A microelectromechanical device comprising:
    a chamber;
    a first encapsulation layer having at least one vent formed therein, wherein first encapsulation layer is at least a portion of a wall of the chamber;

a micromechanical structure, wherein at least a portion of the micromechanical structure is disposed in the chamber; and a second encapsulation layer, disposed in the at least one vent to seal the chamber, wherein the second encapsulation layer is a semiconductor material.

2. The microelectromechanical device of claim 1 wherein the second encapsulation layer is polycrystalline silicon, porous polycrystalline silicon, amorphous silicon, silicon carbide, silicon/germanium, germanium, or gallium arsenide.

3. The microelectromechanical device of claim 2 wherein the first encapsulation layer is polycrystalline silicon, porous polycrystalline silicon, amorphous silicon, germanium, silicon/germanium, gallium arsenide, silicon nitride or silicon carbide.

4. The microelectromechanical device of claim 1 wherein:
the first encapsulation layer is a semiconductor material that is doped with a first impurity to provide a first region of a first conductivity type, and
the semiconductor material of the second encapsulation layer is doped with a second impurity to provide a second region with a second conductivity type, wherein the first conductivity type is opposite the second conductivity type.

5. The microelectromechanical device of claim 1 further including a contact which is at least partially disposed outside the chamber.

6. The microelectromechanical device of claim 5 wherein the contact is a semiconductor material that is doped with an impurity to increase the electrical conductivity of the contact.

7. The microelectromechanical device of claim 1 wherein a first portion of the first encapsulation layer is monocrystalline silicon and a second portion is polycrystalline silicon, and wherein the second portion is at least the portion of the wall of the chamber.

8. The microelectromechanical device of claim 1 wherein a first portion of the first encapsulation layer is monocrystalline silicon and a second portion is porous or amorphous silicon, and wherein the second portion is a portion of the wall of the chamber.

9. The microelectromechanical device of claim 8 wherein the second encapsulation layer overlies the second portion of the first encapsulation layer and wherein the portion of the second encapsulation layer that overlies the second portion of the first encapsulation layer is polycrystalline silicon.

10. The microelectromechanical device of claim 9 further including a field region disposed outside and above the chamber wherein the field region includes monocrystalline silicon.

11. The electromechanical device of claim 5 further including an insulation layer disposed on at least the second encapsulation layer that is disposed in or on the at least one vent, wherein the insulation layer includes an opening over the contact and wherein the microelectromechanical device further includes a highly electrically conductive layer that is disposed in the opening and on the contact and on at least a portion of the insulation layer.

12. The microelectromechanical device of claim 1 wherein:
the first encapsulation layer includes a plurality of vents formed therein, and wherein the plurality of vents are substantially perpendicular to a substrate; and
a second encapsulation layer, disposed over and in the plurality of vents to seal the chamber.

13. The microelectromechanical device of claim 12 wherein the second encapsulation layer is polycrystalline silicon, porous polycrystalline silicon, amorphous silicon, silicon carbide, silicon/germanium, germanium, or gallium arsenide.

14. The microelectromechanical device of claim 13 wherein the first encapsulation layer is polycrystalline silicon, porous polycrystalline silicon, amorphous silicon, germanium, silicon/germanium, gallium arsenide, silicon nitride or silicon carbide.

15. The microelectromechanical device of claim 12 wherein:
the first encapsulation layer is a semiconductor material that is doped with a first impurity to provide a first region of a first conductivity type, and
the semiconductor material of the second encapsulation layer is doped with a second impurity to provide a second region with a second conductivity type, wherein the first conductivity type is opposite the second conductivity type.

16. The microelectromechanical device of claim 12 further including a contact which is at least partially disposed outside the chamber, wherein the contact is a semiconductor material that is doped with an impurity to increase the electrical conductivity of the contact.

17. The microelectromechanical device of claim 16 further including an insulation layer disposed on the second encapsulation layer.

18. The microelectromechanical device of claim 17 wherein the insulation layer includes an opening over the contact and wherein the microelectromechanical device further includes a highly electrically conductive layer that is disposed in the opening, on the contact, and on at least a portion of the insulating layer.

19. The microelectromechanical device of claim 12 wherein a first portion of the first encapsulation layer is monocrystalline silicon and a second portion is porous or amorphous silicon, and wherein the second portion of the first encapsulation layer is at least the portion of the wall of the chamber.

20. The microelectromechanical device of claim 19 wherein the second encapsulation layer overlies the second portion of the first encapsulation layer and wherein the portion of the second encapsulation layer that overlies the second portion of the first encapsulation layer is polycrystalline silicon.

21. The microelectromechanical device of claim 1 wherein:
the first encapsulation layer includes a plurality of vents formed therein, and wherein the first encapsulation layer is a semiconductor material; and
a second encapsulation layer, disposed over or in the plurality of vents to seal the chamber.

22. The microelectromechanical device of claim 21 wherein:
the first encapsulation layer is polycrystalline silicon, porous polycrystalline silicon, amorphous silicon, germanium, silicon/germanium, gallium arsenide, silicon nitride or silicon carbide, and
the second encapsulation layer is polycrystalline silicon, silicon carbide, silicon/germanium, germanium, or gallium arsenide.

23. The microelectromechanical device of claim 22 further including a third encapsulation layer disposed on the second encapsulation layer, wherein the third encapsulation layer is an insulation material.

24. The microelectromechanical device of claim 21 wherein:
the first encapsulation layer is a semiconductor material that is doped with a first impurity to provide a first region of a first conductivity type, and
the semiconductor material of the second encapsulation layer is doped with a second impurity to provide a second region with a second conductivity type, wherein the first conductivity type is opposite the second conductivity type.

25. The microelectromechanical device of claim 24 further including a contact which is at least partially disposed outside the chamber, wherein the contact is a semiconductor material that is doped with the first impurity.

26. The microelectromechanical device of claim 25 further including an insulation layer disposed on at least a portion of the first and second encapsulation layers.

27. The microelectromechanical device of claim 26 wherein the insulation layer includes an opening over the contact and wherein the microelectromechanical device further includes an electrically conductive layer that is disposed in the opening, on the contact and on at least a portion of a surface of the insulation layer such that the insulation layer electrically insolates the electrically conductive layer from the first and/or second encapsulation layers.

28. The microelectromechanical device of claim 1 wherein the second encapsulation layer includes polycrystalline silicon.

29. The microelectromechanical device of claim 28 wherein the polycrystalline silicon includes epitaxially deposited polycrystalline silicon.

30. The microelectromechanical device of claim 29 wherein a first portion of the first encapsulation layer is monocrystalline silicon and a second portion is polycrystalline silicon, and wherein the second portion is at least the portion of the wall of the chamber.

31. The electromechanical device of claim 28 further including:
a contact which is at least partially disposed outside the chamber; and
an insulation layer disposed on at least the second encapsulation layer that is disposed in or on the at least one vent, wherein the insulation layer includes an opening over the contact and wherein the microelectromechanical device further includes a highly electrically conductive layer that is disposed in the opening and on: (i) the contact and (ii) at least a portion of the insulation layer.

32. The microelectromechanical device of claim 28 further including a third encapsulation layer disposed on the second encapsulation layer.

33. The microelectromechanical device of claim 32 wherein the third encapsulation layer is an insulating or metal material.

34. The microelectromechanical device of claim 32 wherein the third encapsulation layer is a metal material including aluminum, chromium, gold, silver, molybdenum, platinum, palladium, tungsten, titanium, silicide and/or copper.

35. The microelectromechanical device of claim 32 wherein the third encapsulation layer is an insulating material including silicon dioxide, silicon nitride, BPSG, PSG and/or SOG.

36. The microelectromechanical device of claim 12 wherein the second encapsulation layer includes polycrystalline silicon.

37. The microelectromechanical device of claim 36 wherein the polycrystalline silicon includes epitaxially deposited polycrystalline silicon.

38. The microelectromechanical device of claim 37 further including a third encapsulation layer disposed on the second encapsulation layer.

39. The microelectromechanical device of claim 37 wherein the third encapsulation layer is an insulating or metal material.

40. The microelectromechanical device of claim 21 wherein the second encapsulation layer includes polycrystalline silicon.

41. The microelectromechanical device of claim 40 wherein the polycrystalline silicon includes epitaxially deposited polycrystalline silicon.

42. The microelectromechanical device of claim 41 further including a third encapsulation layer disposed on the second encapsulation layer.

43. The microelectromechanical device of claim 42 wherein the third encapsulation layer is an insulating or metal material.

* * * * *